(12) United States Patent  (10) Patent No.: US 7,597,492 B2
Hayashida et al.  (45) Date of Patent: Oct. 6, 2009

(54) COATING AND DEVELOPING SYSTEM, COATING AND DEVELOPING METHOD AND STORAGE MEDIUM

(75) Inventors: Yasushi Hayashida, Koshi (JP); Yoshitaka Hara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 119 days.

(21) Appl. No.: 11/987,661

(22) Filed: Dec. 3, 2007

(65) Prior Publication Data

US 2008/0129968 A1  Jun. 5, 2008

(30) Foreign Application Priority Data

Dec. 5, 2006 (JP) ............... 2006-328562

(51) Int. Cl.
*G03D 5/00* (2006.01)
*G03B 27/32* (2006.01)
*B05C 13/00* (2006.01)
*G06F 19/00* (2006.01)

(52) U.S. Cl. .......................... 396/611; 355/27; 118/52; 700/121

(58) Field of Classification Search .............. 396/572, 396/611; 355/27, 30; 118/52; 414/935; 700/100, 121
See application file for complete search history.

(56) References Cited

U.S. PATENT DOCUMENTS 7,262,829 B2 * 8/2007 Hayashida et al. ............. 355/27
7,322,756 B2 * 1/2008 Akimoto et al. ............. 396/611
7,379,785 B2 * 5/2008 Higashi et al. ............... 700/112
2005/0287821 A1 12/2005 Higashi et al.
2006/0130750 A1 * 6/2006 Ishikawa et al. ............. 118/300
2006/0165408 A1 * 7/2006 Akimoto et al. ............. 396/564
2006/0183340 A1 8/2006 Hayashida et al.
2006/0203075 A1 * 9/2006 Vazac et al. ................. 347/171

FOREIGN PATENT DOCUMENTS

JP  2004-193597  7/2004
JP  2006-203075  8/2006
JP  2006-222398  8/2006

* cited by examiner

*Primary Examiner*—Alan A Mathews
(74) *Attorney, Agent, or Firm*—Smith, Gambrell & Russell, LLP

(57) ABSTRACT

A buffer module is installed in a coating film forming unit block of a coating and developing system to reduce the number of interface arms needed by an interface block, and the manufacturing cost and footprint of the coating and developing system. For example, buffer modules BF31 to BF34 capable of holding a number of wafers W greater by one than the number of coating modules COT1 to COT3 of a COT layer B3 is installed in the COT layer B3, In the COT layer B3, a wafer W is carried along a carrying route passing a temperature control module CPL3, COT1 to COT3, a heating and cooling module LHP3, and the buffer modules BF31 to BF34. A main arm A3 carries wafers W such that the number of wafers W placed in the modules on the downstream side of the CPL3 is greater by one than the number of modules between the CPL3 and the buffer module when a processing rate at which an exposure system processes wafers W is lower that at which the COT layer B3 processes wafers W.

24 Claims, 15 Drawing Sheets

| CARRYING CYCLE | CB | BCT LAYER B2 | | | | | | COT LAYER B3 | | | | | | | S-CPL | EXP |
|---|---|---|---|---|---|---|---|---|---|---|---|---|---|---|---|---|
| | | CPL2 | BCT1 | BCT2 | BCT3 | LHP2 | BF21 | CPL3 | COT1 | COT2 | COT3 | LHP3 | WEE | BF31 | | |
| 1 | W01 | | | | | | | | | | | | | | | |
| 2 | W02 | W01 | | | | | | | | | | | | | | |
| 3 | W03 | W02 | | | | | | | | | | | | | | |
| 4 | W04 | W03 | W01 | | | | | | | | | | | | | |
| 5 | W05 | W04 | | W02 | | | | | | | | | | | | |
| 6 | W06 | W05 | | | W03 | W01 | | | | | | | | | | |
| 7 | W07 | W06 | W04 | | | W02 | W01 | | | | | | | | | |
| 8 | W08 | W07 | | W05 | | W03 | W02 | W01 | | | | | | | | |
| 9 | W09 | W08 | | | W06 | W04 | W03 | W02 | | | | | | | | |
| 10 | W10 | W09 | W07 | | | W05 | W04 | W03 | W01 | | | | | | | |
| 11 | W11 | W10 | | W08 | | W06 | W05 | W04 | | W02 | | | | | | |
| 12 | W12 | W11 | | | W09 | W07 | W06 | W05 | | | W03 | W01 | | | | |
| 13 | W13 | W12 | W10 | | | W08 | W07 | W06 | W04 | | | W02 | W01 | | | |
| 14 | W14 | W13 | | W11 | | W09 | W08 | W07 | | W05 | | W03 | W02 | W01 | | |
| 15 | W15 | W14 | | | W12 | W10 | W09 | W08 | | | W06 | W04 | W03 | W02 | W01 | |
| 16 | W16 | W15 | W13 | | | W11 | W10 | W09 | W07 | | | W05 | W04 | W03 | W02 | W01 |
| 17 | W17 | W16 | | W14 | | W12 | W11 | W10 | | W08 | | W06 | W05 | W04 | W03 | W02 |
| 18 | W18 | W17 | | | W15 | W13 | W12 | W11 | | | W09 | W07 | W06 | W05 | W04 | W03 |
| 19 | W19 | W18 | W16 | | | W14 | W13 | W12 | W10 | | | W08 | W07 | W06 | W05 | W04 |
| 20 | W20 | W19 | | W17 | | W15 | W14 | W13 | | W11 | | W09 | W08 | W07 | W06 | W05 |
| 21 | W21 | W20 | | | W18 | W16 | W15 | W14 | | | W12 | W10 | W09 | W08 | W07 | W06 |
| 22 | W22 | W21 | W19 | | | W17 | W16 | W15 | W13 | | | W11 | W10 | W09 | W08 | W07 |
| 23 | W23 | W22 | | W20 | | W18 | W17 | W16 | | W14 | | W12 | W11 | W10 | W09 | W08 |
| 24 | W24 | W23 | | | W21 | W19 | W18 | W17 | | | W15 | W13 | W12 | W11 | W10 | W09 |
| 25 | W25 | W24 | W22 | | | W20 | W19 | W18 | W16 | | | W14 | W13 | W12 | W11 | W10 |
| 26 | | W25 | | W23 | | W21 | W20 | W19 | | W17 | | W15 | W14 | W13 | W12 | W11 |
| 27 | | | | | W24 | W22 | W21 | W20 | | | W18 | W16 | W15 | W14 | W13 | W12 |
| 28 | | | W25 | | | W23 | W22 | W21 | W19 | | | W17 | W16 | W15 | W14 | W13 |
| 29 | | | | | | W24 | W23 | W22 | | W20 | | W18 | W17 | W16 | W15 | W14 |
| 30 | | | | | | W25 | W24 | W23 | | | W21 | W19 | W18 | W17 | W16 | W15 |
| 31 | | | | | | | W25 | W24 | W22 | | | W20 | W19 | W18 | W17 | W16 |
| 32 | | | | | | | | W25 | | W23 | | W21 | W20 | W19 | W18 | W17 |
| 33 | | | | | | | | | | | W24 | W22 | W21 | W20 | W19 | W18 |
| 34 | | | | | | | | | W25 | | | W23 | W22 | W21 | W20 | W19 |
| 35 | | | | | | | | | | | | W24 | W23 | W22 | W21 | W20 |
| 36 | | | | | | | | | | | | W25 | W24 | W23 | W22 | W21 |
| 37 | | | | | | | | | | | | | W25 | W24 | W23 | W22 |
| 38 | | | | | | | | | | | | | | W25 | W24 | W23 |
| 39 | | | | | | | | | | | | | | | W25 | W24 |
| 40 | | | | | | | | | | | | | | | | W25 |

COATING AND DEVELOPING SYSTEM, COATING AND DEVELOPING METHOD AND STORAGE MEDIUM

BACKGROUND OF THE INVENTION

1. Field of the Invention

The present invention relates to a coating and developing system for coating a substrate, such as a semiconductor wafer or an LCD substrate, namely, a glass substrate for a liquid crystal display, with a resist solution by a coating process and processing the substrate by a developing process after exposure, a coating and developing method to be carried out by the coating and developing system, and a storage medium.

2. Description of the Related Art

A manufacturing process for manufacturing a semiconductor device or an LCD substrate forms a resist patter on a substrate by photolithography. Photolithography includes a series of steps of coating a surface of a substrate, such as a semiconductor wafer (hereinafter, referred to as "wafer") with a resist film by applying a resist solution to the surface, exposing the resist film to light through a photomask, and processing the exposed resist film by a developing process to form a desired pattern.

Generally, those processes are carried out by a resist pattern forming system constructed by connecting an exposure system to a coating and developing system for coating a surface of a substrate with a resist solution and developing an exposed film. Such a resist pattern forming system is proposed in, for example, JP-A 2004-193597. Referring to FIG. 15 showing this known resist pattern forming system, a carrier 10 containing a plurality of wafers W is delivered to a carrier stage 11 included in a carrier block 1A, and a transfer arm 12 transfers the wafer W contained in the carrier 10 to a processing block 1B. Then, the wafer W is carried in the processing block 1B to an antireflection film forming module, an antireflection film is formed on a surface of the wafer W, and then the wafer W is carried to a coating module 13A to coat the antireflection film with a resist solution. Then, the wafer W is carried through an interface block 1C to an exposure system 1D. After the wafer W has been processed by an exposure process, the wafer W is returned to the processing block 1B. Then, the wafer W is processed by a developing process in a developing module 13B, and then the wafer W is returned to the carrier 10. The antireflection film forming module, not shown, is disposed, for example, under the coating module 13A or the developing module 13B.

Heating modules and cooling modules for processing a wafer W before and after processing the wafer W by the antireflection film forming module and the coating module 13A by a predetermined heating process and a predetermined cooling process, and transfer stages are stacked in layers in shelf modules 14 (shelf modules 14a to 14c). Two carrying devices 15A and 15B installed in the processing block 1B carry the wafer W in the processing block 1B from one to other of modules that receive the wafer W, such as the antireflection film forming module, the coating module 13A, the developing module 13, and component units of the shelf modules 14a to 14c. The wafer W is subjected to the foregoing processes. As mentioned in JP-A 2004-193597, wafers W to be subjected to the foregoing processes are carried to the modules according to a carrying schedule defining timing for carrying the wafers W to the modules, respectively.

The interface block 1C of this coating and developing system is provided with a buffer 16 capable of holding a plurality of wafers W. When the respective processing rates at which the processing block 1B and the exposure system 1D process substrates are different from each other, the buffer 16 is used to absorb the difference in processing rate between the processing block 1B and the exposure system 1D. For example, if the processing rate of the processing block 1B is higher than that of the exposure system 1D, wafers W processed by the processing block 1B are carried to the buffer 16, and the wafers W are held until times when the wafers W are to be carried to the exposure system 1D, respectively.

The buffer 16 is capable of holding all the wafers W existing in the processing block 1B when the exposure system 1D is stopped by some cause; that is, the number of wafers W that can be held by the buffer 16 is greater than the number of all the modules of the processing block 1B. For example, if the processing block 1B has fourteen modules, the buffer 16 can hold sixteen wafers W. Delivery of wafers W to the processing block 1B is stopped and wafers W existing in the processing block 1B are processed by all the processes to be carried out before processing the wafers W by the exposure process if the exposure system 1D is stopped. The buffer 16 has such a capacity to hold all those wafers W processed in the processing block 1B until the exposure system 1D resumes the exposure process. When the wafers W are held by the buffer 16, coating films formed on the wafers W and processed by the processes preceding the exposure process are in the same state and the quality of the coating films will not deteriorate even if the wafers W are held in that state. The coating film forming process can be continued by processing the wafers W by the exposure process after the exposure system 1D has resumed its operation, and thus the reduction of yield can be suppressed.

When the buffer 16 having a large capacity to hold many wafers W is installed in the interface block 1C, load on the carrying arm of the interface block IC in creases. Therefore, to achieve a desired throughput, two carrying chambers, namely, a first carrying chamber 17A and a second carrying chamber 17B, are formed in the interface block 1C of this coating and developing system, carrying arms 18A and 18B are installed in the carrying chambers 17A and 17B, respectively, to share the carrying load by the two carrying arms 18A and 18B. However, when the large buffer 16 having a large capacity, and the two carrying arms 18A and 18B are installed in the interface block 1C, the interface block 1C needs a large footprint, and the use of the two carrying arms 18A and 18B increases the manufacturing cost and the operation cost.

The inventors of the present invention are making efforts to improve carrying efficiency by reducing load on carrying means and to increase the throughput of the coating and developing system by forming an area in which modules for carrying out processes preceding the exposure process and an area in which modules for carrying out processes succeeding the exposure process in a vertical arrangement and installing carrying means in the two areas, respectively. A system having an area for the coating process and an area for the developing process formed in a vertical arrangement, and carrying means installed in those areas, respectively, is disclosed in JP-A 2006-203075.

Since the carrying means carry wafers W according to the carrying schedule in those areas, respectively, it is possible that the foregoing problems arise when the respective processing rates of the exposure system and the coating and developing system are different. Nothing is mentioned about this problem in JP-A 2006-203075.

SUMMARY OF THE INVENTION

The present invention has been made under such circumstances and it is therefore an object of the present invention to provide techniques that reduces the number of the carrying arms installed in the interface block to reduce the manufacturing cost and to reduce the footprint of the system by installing a buffer module in a coating film forming unit block.

A coating and developing system according to the present invention for forming coating films including a resist film on a substrate carried to a carrier block by a carrier by one or a plurality of coating film forming unit blocks stacked one on top of another, carrying the substrate through an interface block to an exposure system after the coating films including the resist film have been formed on the substrate, processing the substrate returned through the interface block from the exposure system by a developing process by a developing unit block put on top of the stacked coating film forming unit blocks, and transferring the substrate processed in the developing unit block to the carrier block, each of the unit blocks comprising a plurality of modules in which the substrate is placed, and a substrate carrying means for carrying the substrate among the modules, the substrate carrying means repeating a carrying cycle in which substrates are carried according to a predetermined carrying schedule to transfer the substrates in due order from the upstream modules to the downstream modules such that the substrates of lower numbers are in the modules of higher ordinal numbers than the substrates of higher numbers includes:

temperature control modules for controlling the temperature of the substrate, wet processing modules for coating the substrate with a coating solution, and heating and cooling modules for heating the substrate and cooling the heated substrate installed in the coating film forming unit blocks;

buffer modules each capable of holding a number of substrates greater by n than the number of the wet processing modules; and a controller for controlling the substrate carrying means of each of the unit blocks to carry the substrate in the coating film forming unit block along a carrying route passing the temperature control module, the wet processing module, the heating and cooling module and the buffer module in that order such that the number of substrates placed in the modules on the downstream side of the temperature control module is greater by n than the number of the modules between the temperature control module and the buffer module on the carrying route when a processing rate at which the exposure system processes substrates is lower than that at which the unit block processes substrates.

The a cycle time in which the coating film forming unit block processes one substrate at the processing rate is equal to one carrying cycle time in which one carrying cycle of the carrying schedule is completed.

The heating and cooling module has a heating module for heating a substrate, a substrate holding zone in which a substrate is held without being heated, and a carrying means for carrying a wafer between the heating module and the substrate holding zone. A state in which a substrate is not heated is one of states in which a substrate is cooled. The heating module may be a heating plate or a heating chamber in which a substrate is placed for heating. The substrate holding zone may be a zone in which a cooling plate on which a substrate is placed for cooling is installed or may be a zone in which the carrying means holds a substrate outside the heating module.

A coating and developing system according to the present invention includes: temperature control modules for controlling the temperature of a substrate, wet processing modules for coating a substrate with a coating solution and heating and cooling modules for heating a substrate and cooling the heated substrate installed in the coating film forming unit block;

a buffer module capable of holding a number of substrates greater by n than the number of the wet processing modules and installed in the coating film forming unit block; and a controller for controlling a substrate carrying means of the unit block controls, upon the occurrence of trouble in the exposure system, the carrying means such that a substrate is carried along a carrying route in order of the temperature control module, the wet processing module, the heating and cooling module and the buffer module, the number of substrates placed in the modules on the downstream side of the temperature control module is greater by n than the number of the modules on the carrying route on the downstream of the temperature control module and on the upstream side of the buffer module, and the carrying means of the unit block carries substrates processed normally by the coating film forming unit block to the buffer module, and provides a control command requesting inhibiting carrying a substrate into the unit block.

The heating and cooling module may include a heating module for heating a substrate and a cooling module for cooling a substrate, the controller may control the substrate carrying means of the unit block such that the number of substrates placed in the modules on the downstream side of the temperature control module is greater by n−1 than the number of modules on the downstream side of the temperature control module and on the upstream side of the buffer module.

The controller may be provided with a control means for controlling the substrate carrying means so as to stop sending out a substrate from the temperature control module when substrates held by the buffer module is increased by one substrate or so as to start carrying a substrate from the buffer module upon the start of a carrying operation for carrying a substrate from the buffer module to the module on the downstream side of the buffer module.

According to the present invention, the developing unit blocks may be provided with transfer units to transfer a substrate from one to another of the unit blocks, and transfer means for transferring a substrate between the transfer units of the unit block, and the buffer module may be formed such that a substrate is transferred between the substrate carrying means of the coating film forming unit block and the transfer means.

A coating and developing method according to the present invention includes the steps of:

forming coating films including a resist film on a substrate carried to a carrier block by a carrier by one coating film forming unit block or by a plurality of coating film forming unit blocks stacked one on top of another;

carrying the substrate through an interface block to an exposure system after the coating films including the resist film have been formed on the substrate; and processing the substrate returned through the interface block from the exposure system by a developing process by a developing unit block put on top of the coating film-forming unit block and transferring the substrate to the carrier block;

the unit block including a plurality of modules in which the substrate is placed, and a substrate carrying means for carrying the substrate among the modules, the substrate carrying means repeating a carrying cycle in which substrates are carried according to a predetermined carrying schedule to transfer the substrates in due order from the upstream modules to the downstream modules such that the substrates of lower ordinal numbers are in the modules of higher ordinal numbers than the substrates of higher ordinal numbers;

wherein the coating film forming unit block includes temperature control modules for controlling the temperature of the substrate, wet processing modules for applying a coating solution to the substrate, heating and cooling modules for heating the substrate and cooling the heated substrate, and a buffer module capable of holding a number of substrates greater than by n than the number of the wet processing modules, the substrate is carried in the coating film forming unit block along a carrying route extending between the temperature control module to the buffer module and passing the temperature control module, the wet processing module, the heating and cooling module and the buffer module in that order, and the substrate carrying means carries substrates such that the number of substrates placed in the modules on the downstream side of the temperature control module is greater by n than the number of the modules between the temperature control module and the buffer module on the carrying route when a processing rate at which the exposure system processes substrates is lower than that at which the coating film forming unit block processes substrates.

A coating and developing method according to the present invention includes the steps of: carrying substrates, when trouble occurs in an exposure system, in the coating film forming unit block including temperature control modules for controlling the temperature of a substrate, wet processing modules for applying a coating solution to a substrate, heating and cooling modules for heating a substrate and cooling the heated substrate, and a buffer module capable of holding a number of substrates greater by n than the number of the modules by the substrate carrying means along a carrying route passing the temperature control module, the wet processing module, the heating and cooling module and the buffer module in that order such that the number of substrates placed in the modules on the downstream side of the temperature control module is grater by n than the number of the modules between the temperature control module and the buffer module, and the substrates placed in the coating film forming unit block are held in the buffer module after being normally processed in the coating film forming unit block;

inhibiting sending out a substrate from the coating film forming unit block; and inhibiting carrying a substrate into the coating film forming unit block.

The heating and cooling module may include a heating module for heating a substrate and a cooling module for cooling a substrate, and the substrate carrying means of the unit block may carry substrates such that the number of substrates placed in the modules on the downstream side of the temperature control module is greater by n−1 than the number of modules between the temperature control module and the buffer module.

A storage medium according to the present invention storing a computer program to be executed by a coating and developing system, which forms coating films including a resist film on a substrate received from a carrier block in which a carrier containing a plurality of substrates is placed by one coating film forming unit block or by a plurality of coating film forming unit blocks stacked one on top of another, and processes the substrate processed by an exposure process by a developing process by a developing unit block put on top of the coating film forming unit block, wherein the computer program includes instructions for carrying out the steps of the coating and developing method according to the present invention.

According to the present invention, the coating film forming unit block is provided with the buffer module. The difference in processing rate between the coating film forming unit block and the exposure system can be absorbed by holding the substrate processed by the coating film forming unit block by the buffer module until the exposure system becomes ready to process the substrate when the processing rate at which the coating film forming unit block processes substrates is higher than that at which the exposure system processes substrates. When the buffer module is installed in the coating film forming unit block, load on the interface block is lower than that loaded on the interface block when the buffer module is installed in the interface block. Consequently, the number of the interface arms can be reduced and the manufacturing cost can be reduced. Since the interface block needs a reduced number of interface arms, the footprint of the interface block is small.

The buffer module capable of holding a number of substrates greater by n than the number of the wet processing modules is installed in the coating film forming unit block, the carrying means carries substrates to the temperature control module, the wet processing module the heating and cooling module and the buffer module in that order such that the number of substrates placed in the modules on the downstream side of the temperature control module is greater by n than the number of the modules on the carrying route on the downstream side of the temperature control module and on the upstream side of the buffer module, and, upon the occurrence of trouble in the exposure system, the carrying means carries substrates processed normally by the coating film forming unit block to the buffer module. Thus coating film forming unit block can complete processing substrates by predetermined processes even if trouble occurs in the exposure system. And hence the reduction of the yield of substrates can be suppressed.

BRIEF DESCRIPTION OF THE DRAWINGS

FIG. 11 is a diagram of assistance in explaining a basic carrying schedule;

FIG. 12 is a diagram of assistance in explaining an example of a carrying schedule specifying carrying operations to be carried out when the processing rates of the COT layer B3 and a BCT layer B2 are higher than that of an exposure system S4;

FIG. 14 is a diagram of assistance in explaining an example of a carrying schedule for a conventional coating and developing system.

DESCRIPTION OF THE PREFERRED EMBODIMENTS

Figure 1:
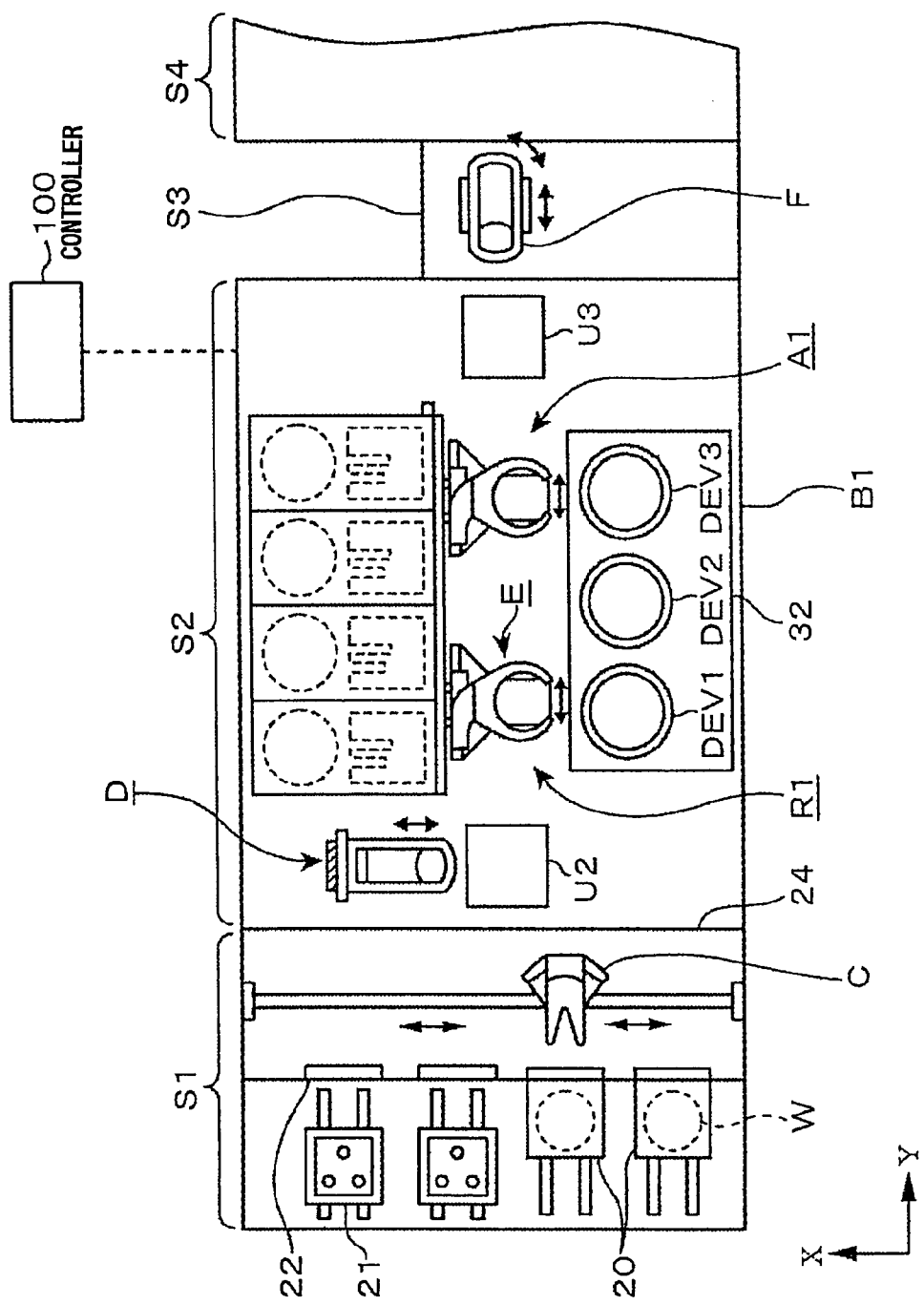
FIG. 1 is a plan view of a coating and developing system in a preferred embodiment according to the present invention.
Figure 2:
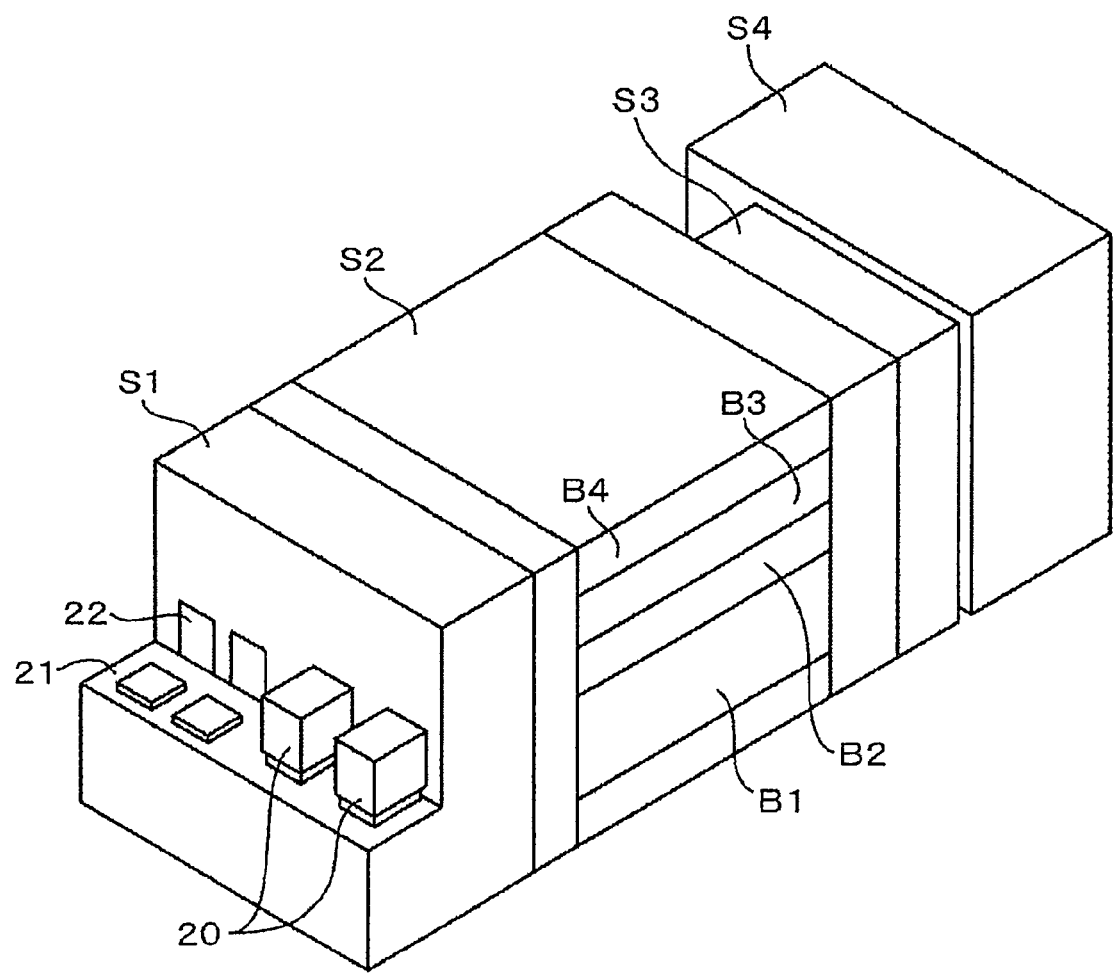
FIG. 2 is a perspective view of the coating and developing system shown in FIG. 1.
Figure 3:
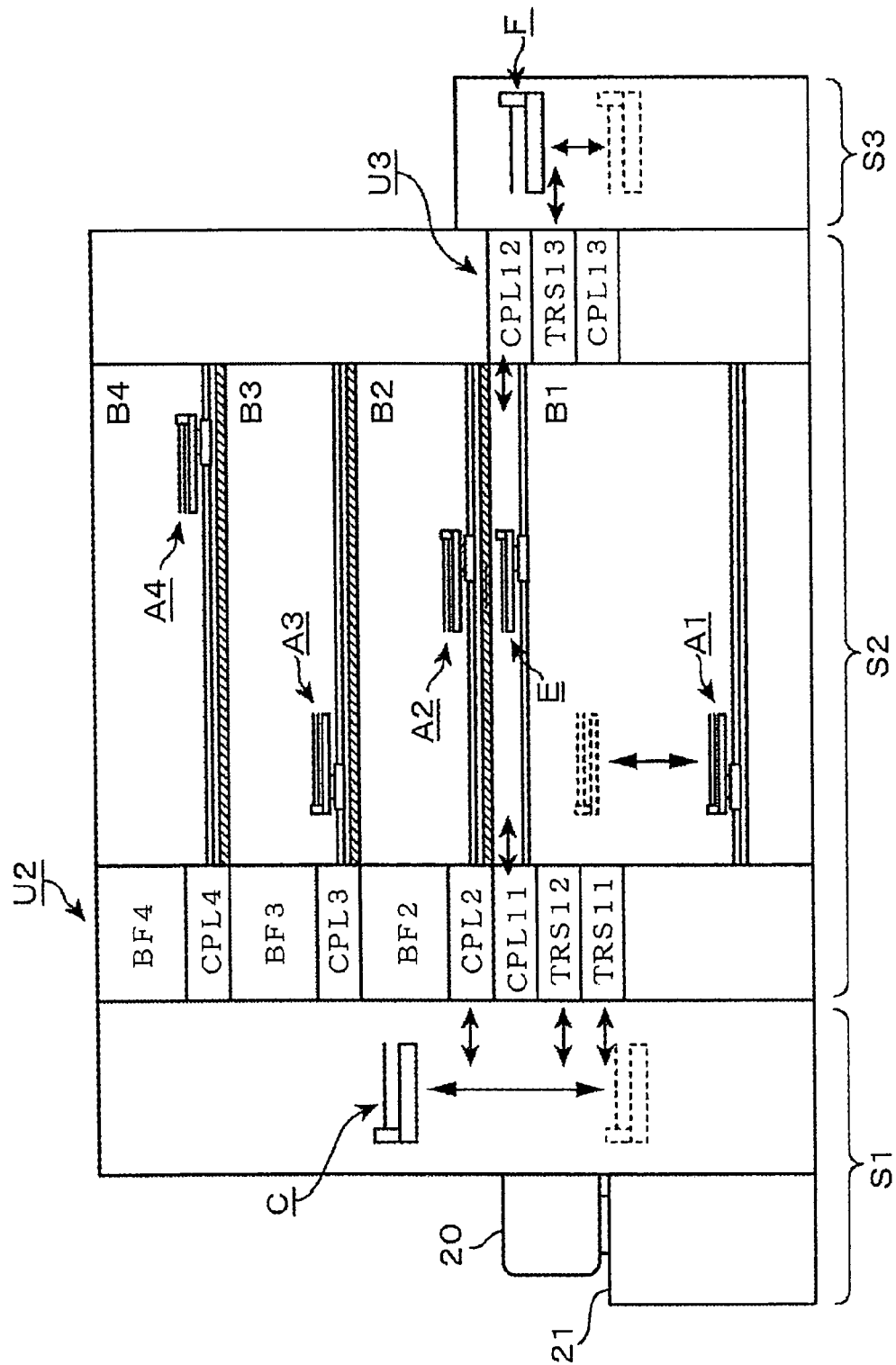
FIG. 3 is a schematic sectional side elevation of the coating and developing system shown in FIG. 1.

A resist pattern forming system in a preferred embodiment of a coating and developing system according to the present invention will be described with reference to the accompanying drawings. FIG. 1, FIG. 2 and FIG. 3 are a plan view, a perspective view and a schematic sectional side elevation, respectively, of the resist pattern forming system. The resist pattern forming system has carrier block S1 for receiving and sending out carriers 20 each containing, for example, thirteen wafers W, namely, substrates, in an airtight fashion, a processing block S2 formed by stacking up a plurality of unit blocks, for example, four unit blocks B1 to B4, an interface block S3, and an exposure system S4.

The carrier block S1 is provided with carrier tables 21 on which carriers 20 are supported, a wall disposed behind the carrier tables 21 and provided with closable openings 22, and a transfer arm C for taking out the wafers W from the carrier 20 through the closable opening 22. The transfer arm C is movable in vertical directions, longitudinal directions, transverse directions and directions in which the carriers 20 are arranged, and turnable about a vertical axis. The transfer arm C carries wafers W from and to a temperature control module CPL2 included in the unit block B2, and transfer stages TRS11 and TRS12 included in the unit block B1.

The processing block S2 surrounded by a box 24 is disposed behind and joined to the carrier block S1. In the processing block S2, the first unit block (DEV layer) B1 for carrying out a developing process, a second unit block (BCT layer) B2 for forming an antireflection film, (hereinafter referred to as "first antireflection film") under a resist film, a third unit block (COT layer) B3 for carrying out a resist film forming process, and a fourth unit block (TCT layer)B4 for forming an antireflection film (Hereinafter referred to as "second antireflection film") on the resist film. The unit blocks B1 to B4 are isolated from each other. The unit blocks B2 to B4 coating film forming unit blocks.

The unit blocks B1 to B4 are similar in construction. The unit blocks B1 to B4 are provided with wet processing modules for coating a wafer W with a coating solution, processing modules, such as heating and cooling modules and temperature control modules, for processing a wafer W by pretreatment processes before the wafer W is processed by the wet processing unit, and by posttreatment processes after the wafer W has been processed by the wet process, and main arms A1 to A4, namely, substrate carrying means, for carrying a wafer W to transfer a wafer W between the wet processing modules and the processing modules. The respective wet processing modules, heating modules, the temperature control modules and the main arms A1 to A4 of the unit blocks B1 to B4 are disposed in the unit blocks B1 to B4 in the same layout. Disposition of the processing modules and the main arms A1 to A4 in the same layout signifies that the respective centers of wafers W placed in the corresponding processing units and on the main arms A1 to A4 are aligned.

As shown in FIGS. 1 to 3, a shelf module U2 is disposed in regions in the unit blocks B1 to B4 adjacent to the carrier block S1. The transfer arm C and the main arms A1 to A4 can access the shelf unit U2. The shelf module U2 has a first transfer unit for each of the unit blocks. A wafer W can be transferred from one to another of the unit blocks through the first transfer unit. A transfer arm D, namely, transfer means, carries a wafer W to and from the transfer units of the shelf module U2. The transfer arm D can move in vertical directions and longitudinal directions. As shown in FIGS. 1 and 3, a shelf module U3 is disposed in a region in the DEV layer B1 adjacent to the interface block S3 such that the main arm A1 of the DEV layer B1 can access the shelf module U3. The shelf module U3 has a second transfer unit through which a wafer W is transferred to and from the interface block S3.

The exposure system S4 is disposed behind the shelf module U3 and is connected to the rear end of the processing block S2 by the interface block S3. An interface arm F is disposed in the interface block B3. The interface arm F transfers a wafer W between the second transfer unit of the shelf module U3 of the DEV layer B1 and the exposure system S4. The interface arm F can move in longitudinal directions and vertical directions and can turn about a vertical axis.

The construction of the unit blocks B1 to B4 will be described. First, the COT layer B3 will be described with reference to FIGS. 3 to 5. A carrying region R1 extends in a longitudinal direction, namely, a direction Y in FIGS. 1 and 4, in a substantially central part of the COT layer B3. A wafer W is carried in the carrying region R1. A coating unit 31 provided with a plurality of coating modules for applying a resist solution to a wafer W is disposed on the right-hand side, as viewed rearward from the front end, namely, from the side of the carrier block S1, of the carrying region R1.

Figure 5:
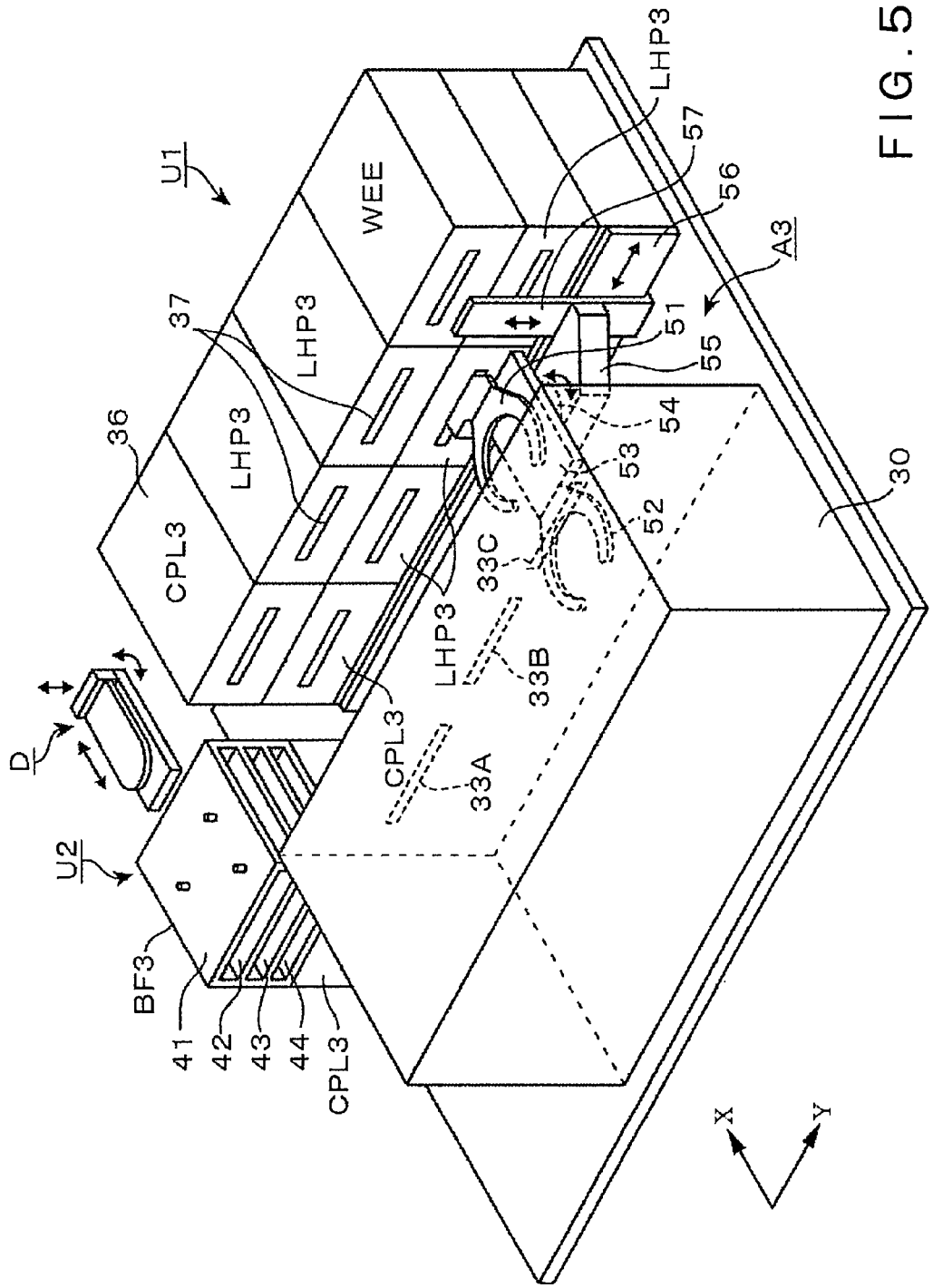
FIG. 5 is a perspective view of a coating module, a shelf module, a main arm A3 and a buffer module in the COT layer B3.

In this embodiment, the plurality of wet processing modules are three coating modules COT1 to COT3 arranged in the direction Y in a processing vessel 30 so as to face the carrying region R1. Each of the coating modules COT1 to COT3 pours a resist solution, namely, a coating solution, through a common chemical solution pouring nozzle onto a wafer W attracted to and held by, for example, a spin chuck in a horizontal position and rotates the wafer W to spread the resist solution over the entire surface of the wafer W. Thus the surface of the wafer W is coated with the resist solution. The processing vessel 30 is provided with openings 33A, 33B and 33C at positions respectively corresponding to the coating modules COT1 to COT3 as shown in FIG. 5. The main arm A3 carries a wafer W into and out of the coating modules COT1 to COT3 through the openings 33A to 33C respectively corresponding to the coating modules COT1 to COT3.

The coating unit 31 has a shelf unit U1 disposed on the other side of the carrying region R1. The shelf unit U1 has processing modules arranged, for example, in two layers and four rows. The processing modules are those for processing a wafer W by a pretreatment process before the wafer W is processed by the coating unit 31 and for processing the wafer W processed by the coating unit 31 by a posttreatment process. Those processing modules include heating and cooling modules LHP3 for processing a wafer W coated with the resist solution by a heating process and processing the heated wafer W by a cooling process, temperature control modules CPL3 for adjusting the temperature of a wafer W to a predetermined temperature, and an edge exposure module WEE.

Each of the heating and cooling modules LHP3 is provided with a heating plate 34 for heating a wafer W mounted thereon and a cooling plate 35 serving also as a carrying arm. A wafer W is transferred between the main arm A3 and the heating plate 34 by the cooling plate 35. Thus each of the heating and cooling modules LHP3 is capable of heating and cooling a wafer W. Each of the heating and cooling modules LHP3 is provided with a water-cooled cooling plate. As shown in FIG. 5, the processing modules including the heating and cooling units LHP3 and the temperature controlling unit CPL3 are contained in processing vessels 36, respectively. The processing vessels 36 are provided with openings 37 facing the carrying region R1, respectively.

The shelf module U2 of the COT layer B3 has a buffer module BF3 capable of holding a plurality of wafers W, and a temperature control module CPL3 for adjusting the temperature of a wafer W to a predetermined temperature. The buffer module BF3 and the temperature control module CPL3 are stacked. The main arm A3 and the transfer arm D of the COT layer B3 can access the buffer module BF3 and the temperature control module CPL3. The buffer module BF3 has a capacity for a number of wafers W corresponding to the number of wafers W that can be held in the unit block A3 provided with the buffer module BF3. The number of wafers W that can be held in the unit block A3 is greater by n than the number of the coating modules COT1 to COT3. It is assumed that n=1 in the following description. Thus the buffer module BF3 is provided with four support stages 41 to 44. Thus the buffer module BF3 can hold four wafers W. Each of the support stages 41 to 44 is provided with a plurality of projections, for example, three projections, on which a wafer W is placed. The projections are arranged on the support stages 41 to 44 so that the projections may not interfere with the main arm A3 and the transfer arm D when the main arm A3 and the transfer arm D advance into spaces extending over the support stages 41 to 44.

The main arm A3 installed in the carrying region R1 will be described. The main arm A3 can carry a wafer to and from all the modules in which a wafer is placed of the COT layer B3, namely, the processing modules of the shelf module U1, the coating modules COT1 to COT3, and the transfer devices of the shelf module U2. The main arm A3 can move in transverse directions, in directions parallel to a Y axis and vertical directions and can turn about a vertical axis.

Figure 4:
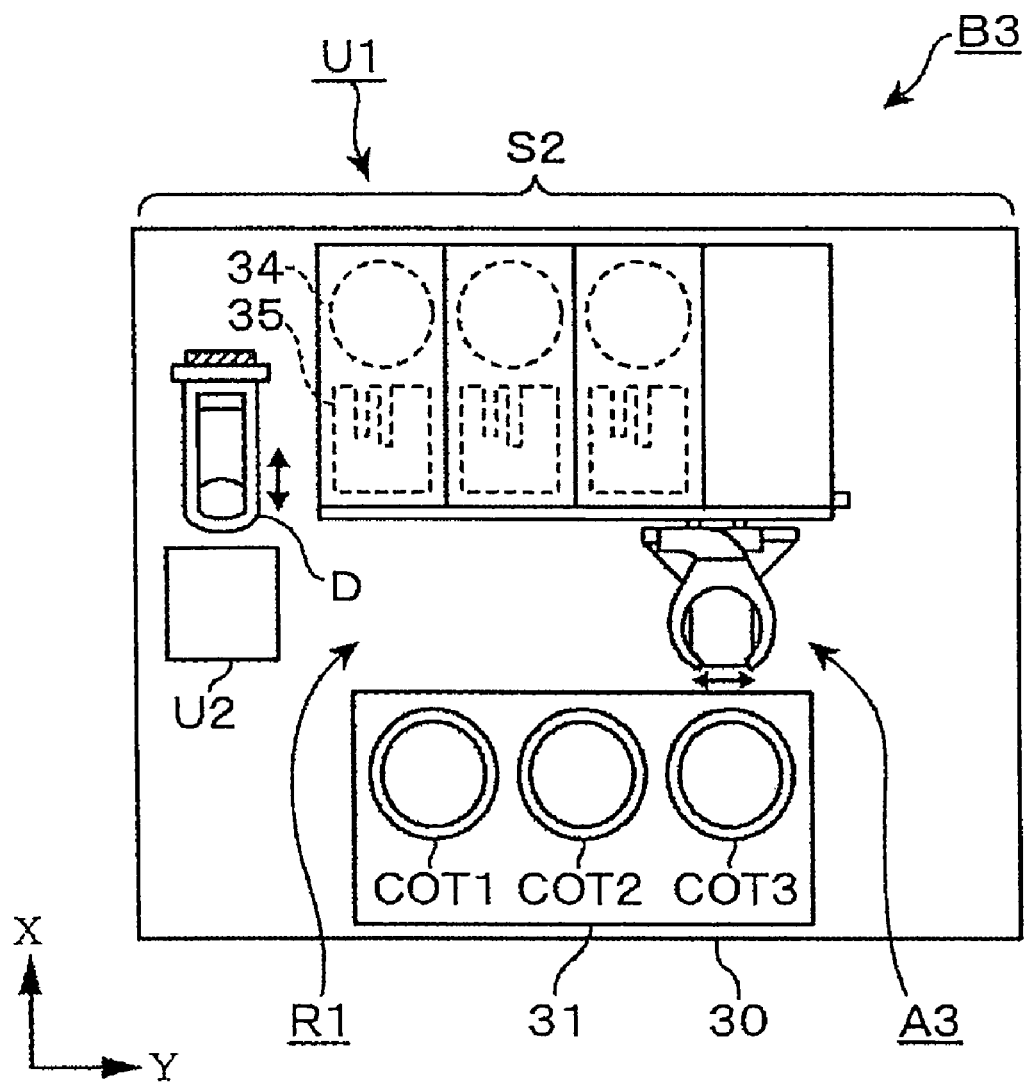
FIG. 4 is a plan view of a unit block in a COT layer B3 included in the coating and developing system shown in FIG. 1.

Referring to FIGS. 3 to 5, the main arm A3 is provided with two support arms 51 and 52 on which peripheral parts of a wafer W is seated. The support arms 51 and 52 can individually move in opposite directions on a base 53. The base 53 is mounted on a carrier body 55 so as to be turned about a vertical axis by a turning mechanism 54. In FIG. 5, indicated at 56 is a horizontal guide rail longitudinally extending in the carrying region R1 in the Y direction (FIG. 1) and at 57 is a vertical guide rail. The carrier body 55 can vertically move along the vertical guide rail 57. A lower end part of the vertical guide rail 57 underlies the horizontal guide rail 56 such that the vertical guide rail 57 can longitudinally move together with the carrier body 55 along the horizontal guide rail 56 in the carrying region R1. The vertical guide rail 57 is connected to the carrier body 55 such that the vertical guide rail 57 does not interfere with each of the support arms 51 and 52 when each of the support arms 51 and 52 is advanced and retracted to transfer a wafer W between each of the support arms 51 and 52 and each of the processing modules of the shelf module U1.

Other unit blocks will briefly be described. The coating film forming unit blocks B2 to B4 are similar in construction. The BCT layer B2 has a first antireflection film forming unit provided with, for example, three first antireflection film forming modules BCT1 to BCT3, namely, wet processing modules. The first antireflection film forming unit coats a surface of a wafer W with a coating solution for forming a first antireflection film. The shelf module U1 has heating and cooling modules LHP2 each provided with a heating plate on which a wafer W processed by an antireflection forming process is subjected to a heating process, and a cooling plate on which a wafer heated by the heating process is subjected to a cooling process, and a temperature control module CPL2 for adjusting the temperature of the wafer W to a predetermined temperature. The shelf module U2 has a buffer module BF2 capable of holding a plurality of wafers W, for example, four wafers W, the number of wafers W being greater by one than the number of the first antireflection film forming modules BCT1 to BCT3, as a first transfer device, and a temperature control module CPL2 for adjusting the temperature of a wafer W to a predetermined temperature and for receiving a wafer W from and returning a wafer W to the carrier block S1. A main arm A2 carries a wafer W to and receives a wafer W from each of those modules.

The TCT layer B4 is provided with, for example, three second antireflection film forming modules TCT1 to TCT3, namely, wet processing modules. Each of the second antireflection film forming modules TCT1 to TCT3 coats a surface of a wafer W with a coating solution for forming a second antireflection film. The shelf module U1 has a heating and cooling modules LHP4 each provided with a heating plate on which a wafer W processed by an antireflection forming process is subjected to a heating process and a cooling plate on which a wafer W heated by the heating process is subjected to a cooling process, a temperature control unit CPL4 for adjusting the temperature of the wafer W to a predetermined temperature, and an edge exposure device WEE. The shelf module U2 has a buffer module BF4, namely, a first transfer module, having a capacity to hold a number of wafers W greater by one than the number of the second antireflection film forming modules TCT1 to TCT3, namely, four wafers W, and a temperature control module CPL4. A main arm A4 carries a wafer W to and receives a wafer W from each of those modules.

Figure 6:
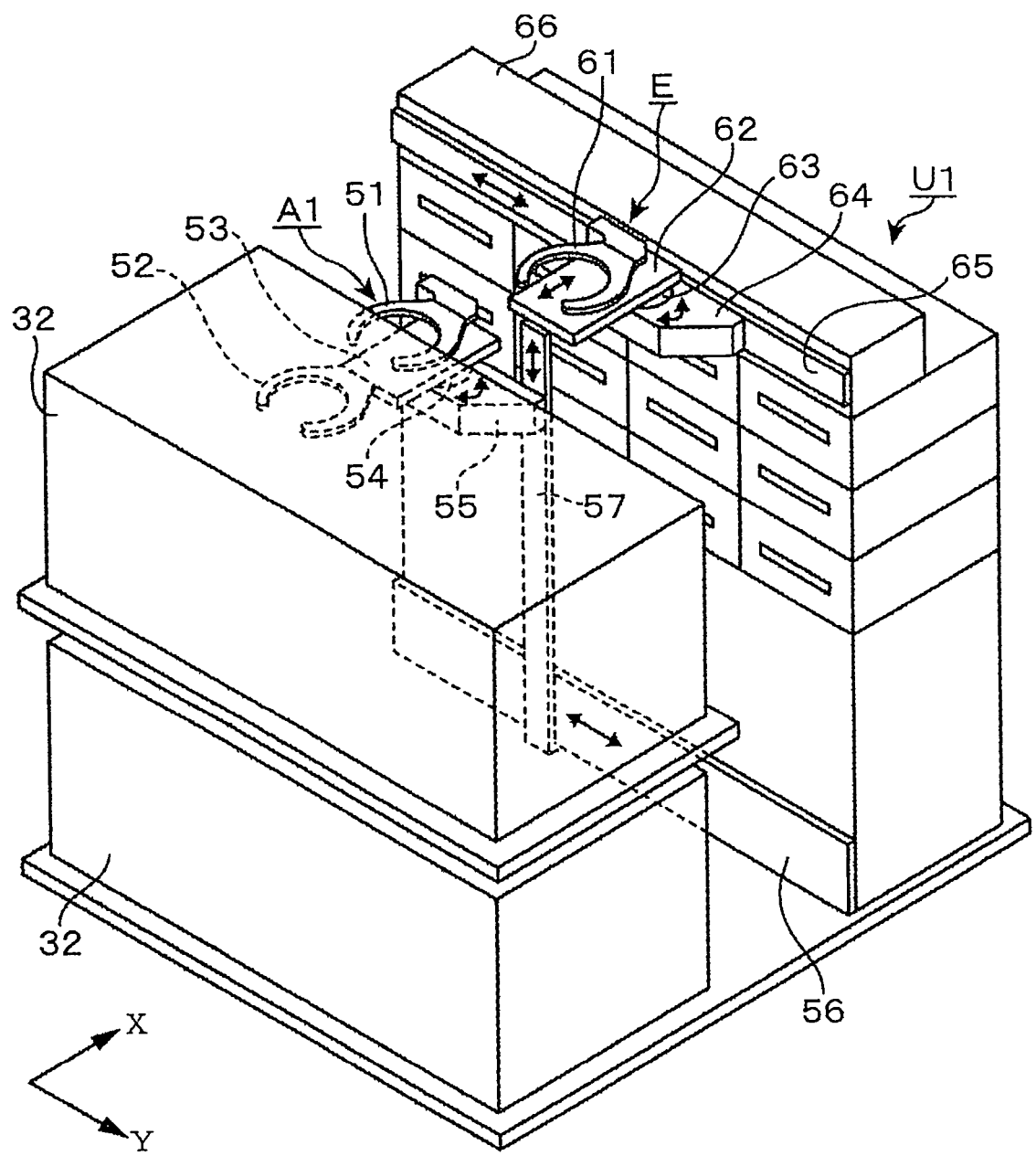
FIG. 6 is a perspective view of a developing module, a shelf module, a main arm A1 and a shuttle arm E in a DEV layer B1 of the coating and developing system.

Referring to FIGS. 1, 3 and 6, the DEV layer B1 has a shelf module U1 including wet processing modules arranged in three layers and four rows, a shelf module U3, and a shuttle arm E. The DEV layer B1 is substantially similar in construction to the COT layer B3 in other respects. The wet processing modules include developing units 32 for processing a wafer W by a developing process using a developer stacked in two layers. Each of the developing units 32 has, for example, three developing modules DEV1 to DEV3. The shelf module U1 includes a heating module PEB1 called a postexposure baking module, for processing a wafer W processed by an exposure process by a heating process, a cooling module COL1 for cooling a wafer processed by the heating module PEB1 at a predetermined temperature, a heating module POST1 called a postbaking module for processing a wafer W processed by a developing process by a heating process to remove moisture from the wafer W, and a temperature control module CPL1 for adjusting the temperature of a wafer W processed by the heating module POST1 to a predetermined temperature. The first and the second antireflection film forming units and the developing units 32 are substantially similar in construction to the coating unit 31.

The shelf module U2 is provided with a temperature control module CPL11 in an upper layer and two transfer stages TRS11 and TRS12 in lower layers. The temperature control module CPL11 serves as a first transfer unit. The shelf module U3 is provided with a temperature control module CPL12 disposed opposite to the temperature control module CPL11 of the shelf module U2 with respect to the carrying region R1. The temperature control module CPL12 serves as a second transfer unit. A transfer stage TRS13 and a temperature control module CPL13 are disposed under the temperature control module CPL12. A wafer W is transferred from and to the carrier block S1 through the transfer stages TRS11 and TRS12 of the shelf module U2. A wafer W is transferred to and from the interface block S3 through the transfer stage TRS13 of the shelf module U3.

Referring to FIGS. 1, 3 and 6, the shuttle arm E is used specially for carrying a wafer W between the temperature control module CPL11 of the shelf module U2 and the temperature control module CPL12 of the shelf module U3, for example, in an upper space in the DEV layer B1. As shown in FIG. 6, the shuttle arm E includes a support arm 61 on which a peripheral part of a wafer W is seated, a base 62, a turning mechanism 63 and a carrier body 64. The support arm 61 is supported on the base 62 so as to be advanced and retracted. The turning mechanism 63 supports the base 62 on the carrier body 64 so as to be turnable about a vertical axis. A guide rail 65 is held on a surface, facing the carrying region R1, of a support member 66 extended in the longitudinal direction parallel to the length of the shelf unit, namely, the Y direction, so as to extend along the carrying region R1, for example, in an upper part of the shelf module U1. The carrier body 64 moves longitudinally along the guide rail 65. The shuttle arm E accesses the temperature control module CPL11 of the shelf module U2 and the temperature control module CPL12 of the shelf module U3 to carry a wafer W between the temperature control modules CPL11 and CPL12.

Figure 7:
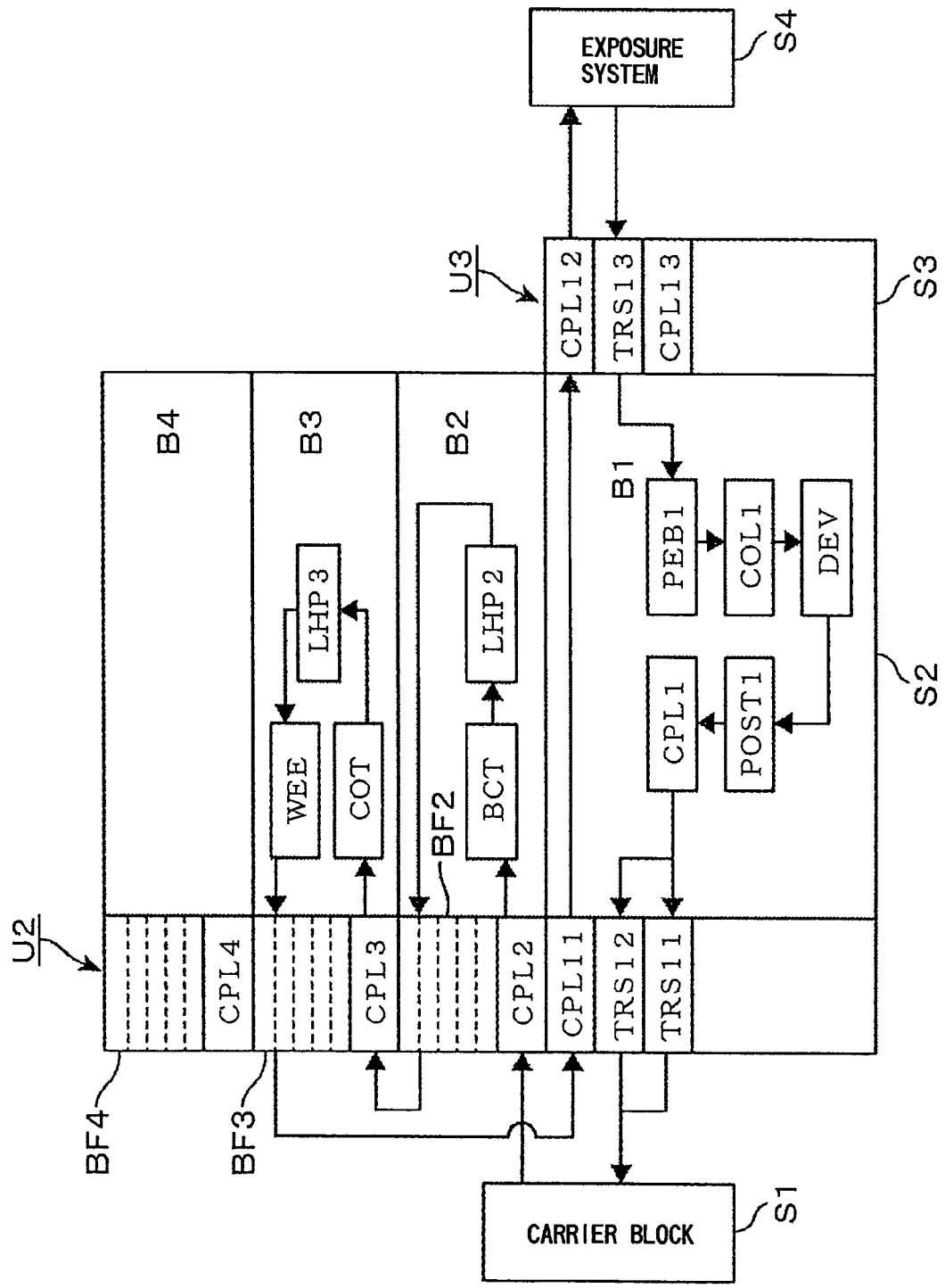
FIG. 7 is a side elevation of assistance in explaining the flow of a wafer W in the coating and developing system.

The flow of a wafer W in the resist pattern forming system will be briefly described for a case where coating films, namely, a first antireflection film and a resist film, are formed on the wafer W with reference to FIG. 7. In FIG. 7, dotted lines in the buffer modules BF2, BF3 and BF4 indicate support stages on which wafers W are held. A carrier 20 containing wafers W is delivered to the carrier block S1. The transfer arm C takes out the wafer W from the carrier 20. Then, the wafer W is transferred through the temperature control module CPL2 of the shelf module U2 to the BCT layer B2. The wafer W is carried along a route passing the main arm A2, one of the first antireflection forming modules BCT1 to BCT3, the main arm A2, and the heating and cooling module LHP2 in that order to form a first antireflection film on a surface of the wafer W.

Subsequently, the main arm A2 takes out the wafer W from the heating and cooling module LHP2, and then the wafer W is carried along a route passing the support stage 41 of the buffer module BF2 of the shelf module U2, the transfer arm D, the temperature control module CPL3 of the shelf module U2, the main arm A3 of the COT layer B3, one of the coating modules COT1 to COT3, the main arm A3, the heating and cooling module LHP3, the main arm A3, and the edge exposure device WEE in that order to form a resist film on the first antireflection film.

Then, the wafer W is carried along a route passing the support stage 41 of the buffer module BF3 of the shelf module U2, the transfer arm D, the temperature control unit CPL11 of the shelf module U2, the shuttle arm E, and the temperature control unit CPL12 of the shelf module U3 in that order. Subsequently, the wafer W is carried by the interface arm F of the interface block S3 to the exposure system S4 and is subjected to a predetermined exposure process.

The wafer W processed by the exposure process is carried along a route passing the interface arm F, the transfer stage TRS13 of the shelf module U3 and the main arm A1 in that order to the DEV layer B1. In the DEV layer B1, the wafer W is carried along a route passing the heating module PEB1, the cooling module COL1, one of the developing modules DEV1 to DEV3, the heating module POST1, and the temperature control module CPL1 in that order to subject the wafer W to a predetermined developing process. The wafer W processed by the developing process is delivered through the transfer stage TRS11 or TRS12 to the transfer arm C. The transfer arm C returns the wafer W to the carrier 20.

The resist pattern forming system is provided with a controller 100. The controller 100, namely, a computer, manages recipes for the processing modules, recipes defining the flow of the wafer W (carrying routes), and controls the processes to be carried out by the processing modules, and operations of the main arms A1 to A4, the transfer arm C, the transfer arm D, the shuttle arm E and the interface arm F. The controller 100 has a program storage device storing a computer program. The program, namely, a piece of software, includes instructions specifying operations of the resist pattern forming system, i.e., steps of the processes to be carried out by the processing modules and steps of carrying a wafer W to form a desired resist pattern on the wafer W. The controller 100 reads the program from the program storage device and controls the operations of the resist pattern forming system according to the program. The program is stored in a storage medium, such as a flexible disk, a hard disk, a compact disk, a magnetooptical disk or a memory card, and the storage medium is held in the storage device.

Figure 8:
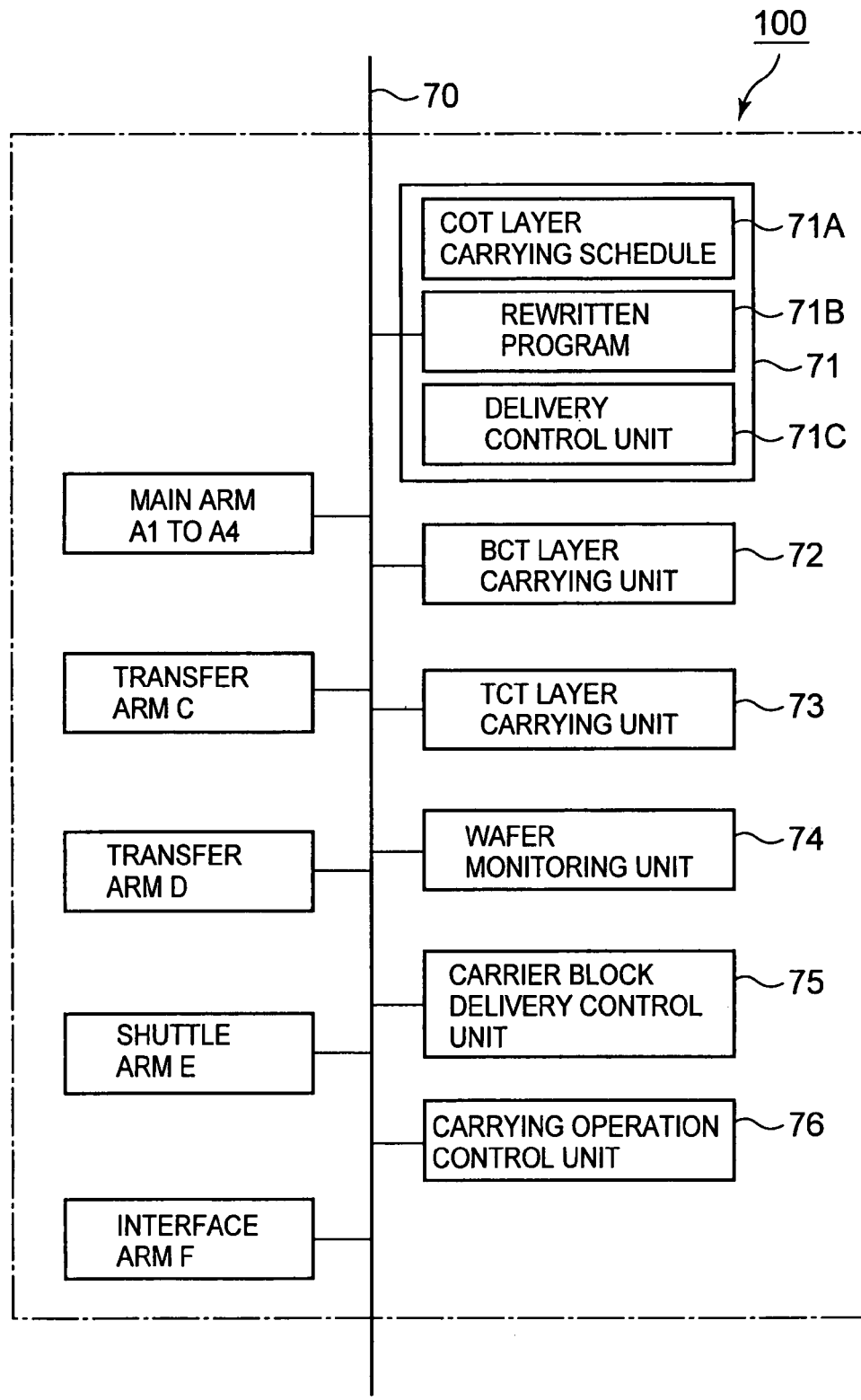
FIG. 8 is a block diagram of an example of a controller included in the coating and developing system.

FIG. 8 shows the configuration of the controller 100. Actually, the controller 100 includes a CPU (central processing unit), a program and a memory. Since the present invention is featured by the mode of carrying a wafer W in the unit blocks B2 to B4 for forming coating films, some of the components related with the mode of carrying a wafer W will be described with reference to a block diagram shown in FIG. 8. Referring to FIG. 8, a COT layer carrying unit 71, a BCT layer carrying unit 72, a TCT layer carrying unit 73, a wafer monitoring unit 74, a carrier block delivery control unit 75, a carrying operation control unit 76, and controllers, not shown, for controlling the main arms A1 to A4, the transfer arm C, the transfer arm D, the shuttle arm E and the interface arm F are connected to a bus 70.

The COT layer carrying unit 71 is provided with a COT layer carrying schedule 71A, a rewrite program 71B and a delivery control unit 71C. For example, the COT layer carrying schedule 71A assigns ordinal numbers indicating carrying order to wafers W and stores a basic carrying schedule formed by arranging carrying cycle data specifying the relation between carrying cycles, the modules and the ordinal numbers assigned to the wafers W in a time series. The rewrite program 71B rewrites the basic carrying schedule when wafers W cannot be carried in predetermined timing specified by the basic carrying schedule.

A state where wafers W cannot be delivered to the temperature control module CPL11 in predetermined timing is a state where wafers W cannot be transferred to the exposure system S4 in predetermined transfer timing specified by the basic carrying schedule, such as a state where the processing rate of the exposure system S4 is lower than those of the coating film forming unit blocks B2 and B3, a state where the exposure system S4 malfunctions or is stopped by some cause or a state where some carrying trouble occurs in the exposure system S4

In this example, the delivery control unit 71C controls sending out wafers W from the temperature control module CPL3 by the main arm A3 such that, in the unit block of the COT layer B3, the number of wafers W placed in the modules on the downstream side of the temperature control module CPL3 does not exceed a number greater by n (one) than the number of modules between the temperature control module CPL3 and the buffer modules BF31 to BF34 i.e., the number of the modules on the wafer carrying route between the temperature control module CPL3 and the edge exposure module WEE (five modules). The buffer modules BF31 to BF34 correspond to the four support stages 41 to 44 of the buffer module BF3.

The delivery control unit 71C controls the main arm A3 such that main arm A3 stops an operation for sending out a wafer W from the temperature control module CPL3 when the number of wafers W held by the buffer modules BF31 to BF34 is increased by one and the main arm A3 resumes the operation for sending out a wafer w from the temperature control module CPL3 upon the start of a carrying operation for carrying a wafer W to the temperature control module CPL11 on the downstream side of the buffer modules BF31 to BF34.

The BCT layer carrying unit 72 has, similarly to the COT layer carrying unit 71, a BCT layer carrying schedule 72A, a rewrite program 72B and a delivery control unit 72C. The BCT layer carrying schedule 72A stores a basic carrying schedule for the BCT layer B2. The rewrite program 72B rewrites the basic carrying schedule when wafers W cannot be carried to the temperature control module CPL3 in predetermined timing specified by the basic carrying schedule.

In this example, the delivery control unit 72C controls operations for sending out wafers W from the temperature control module CPL2 by the main arm A2 such that, in the unit block of the BCT layer B2, the number of wafers W placed in the modules on the downstream side of the temperature control module CPL2 does not exceed a number greater by n (one) than the number of modules on the wafer carrying route between the temperature control module CPL2 and the buffer modules BF21 to BF24 i.e., the number of the modules on the wafer carrying route between the temperature control module CPL2 and the heating and cooling module LHP2(four modules). The buffer modules BF21 to BF24 correspond to the four support stages 41 to 44 of the buffer module BF2.

The delivery control unit 72C controls the main arm A2 such that main arm A2 stops an operation for sending out a wafer W from the temperature control module CPL2 when the number of wafers W held by the buffer modules BF21 to BF24 is increased by one and the main arm A2 resumes the operation for sending out a wafer W from the temperature control module CPL2 upon the start of a carrying operation for carrying a wafer W to the temperature control module CPL3 on the downstream side of the buffer modules BF21 to BF24.

The TCT layer carrying unit 73 has, similarly to the COT layer carrying unit 71, a TCT layer carrying schedule 73A, a rewrite program 73B and a delivery control unit 73C. The BCT layer carrying schedule 73A stores a basic carrying schedule for the TCT layer B4. The rewrite program 73B rewrites the basic carrying schedule when wafers W cannot be carried to the temperature control module CPL11 in predetermined timing.

The delivery control unit 73C controls operations for sending out wafers W from the temperature control module CPL4 by the main arm A4 such that, in the unit block of the TCT layer B4, the number of wafers W placed in the modules on the downstream side of the temperature control module CPL4 does not exceed a. number greater by n (one) than the number of modules on the wafer carrying route between the temperature control module CPL4 and the buffer modules 41 to 44. The buffer modules BF41 to BF44 correspond to the four support stages 41 to 44 of the buffer module BF4. The delivery control unit 73C controls the main arm A4 such that main arm A4 stops an operation for sending out a wafer W from the temperature control module CPL4 when the number of wafers W held by the buffer modules BF41 to BF44 is increased by one and the main arm A4 resumes the operation for sending out a wafer W from the temperature control module CPL4 upon the start of a carrying operation for carrying a wafer W to the temperature control module CPL11 on the downstream side of the buffer modules BF41 to BF44.

The wafer monitoring unit 74 monitors the positions of wafers W in the unit blocks B1 to B4. For example, the wafer monitoring unit 74 finds the number of wafers W in the modules of the unit blocks B1 to B4 by continuously monitoring the modules and the wafers W of the ordinal numbers placed in the modules, respectively.

The carrier block delivery control unit 75 controls the transfer arm C to inhibit carrying a wafer W from the carrier block S1 to the temperature control module CPL2 when a preceding wafer W is placed in the temperature control module CPL2 and a succeeding wafer W cannot be delivered to the temperature control module CPL2. The carrier block delivery control unit 75 controls the transfer arm C to start transferring a wafer W from the carrier block S1 to the temperature control module CPL2 when an operation for carrying a wafer W from the temperature control module CPL2 to the module on the downstream side of the temperature control module CPL2 is started.

The carrying operation control unit 76 refers to the basic carrying schedule or the rewritten carrying schedule, and controls the transfer arm C, the main arms A1 to A4, the transfer arm D, the shuttle arm E and the interface arm F so as to carry a wafer written to carrying cycle data to the specified module to complete a carrying cycle. Thus the carrying operation control unit 76 is a control means for controlling substrate carrying means.

The operation of this embodiment will be described on an assumption that coating films include a first antireflection film and a resist film formed on the first antireflection film, and the processing rates of the coating film forming unit blocks B2 and B3 are higher than that of the exposure system S4. The present invention is featured by the carrying routes along which wafers W are carried from the coating film forming unit blocks B2 and B3 to the exposure system S4. The carrying routes in the BCT layer B2 and the COT layer B3 along which wafers W are carried will be described.

Referring to FIG. 7, a wafer W is carried in the BCT layer B2 and the COT layer B3 along a route passing the carrier block S1, the temperature control module CPL2, one of the first antireflection film forming modules BCT1 to BCT3, the heating and cooling module LHP2, the buffer module BF2, the temperature control module CPL2, one of the coating modules COT1 to COT3, the heating and cooling module LHP3, the edge exposure module WEE, the buffer module BF3, the temperature control module CPL11, the temperature control module CPL12 and the exposure system S4.

Figure 9:
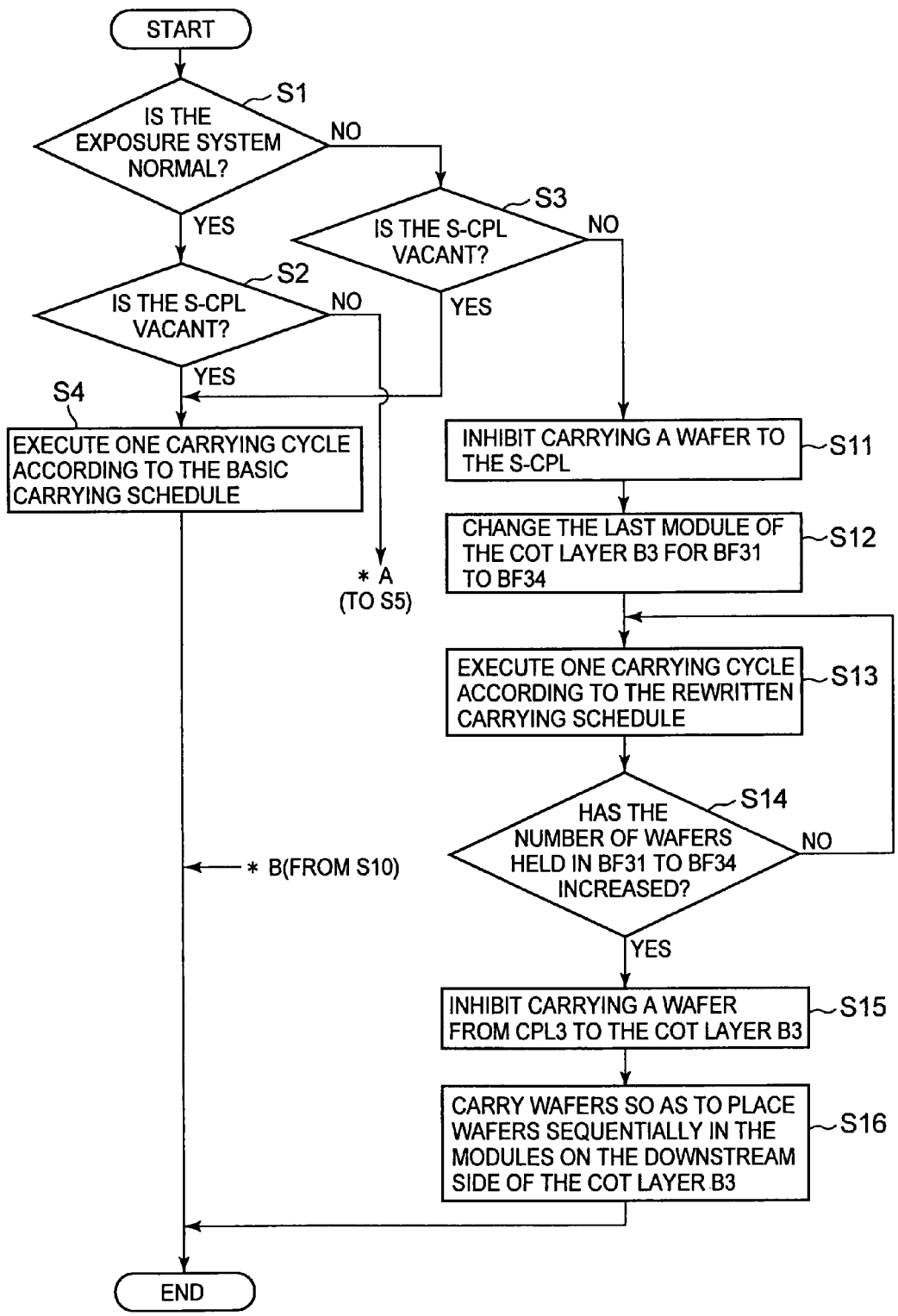
FIG. 9 is a flow chart of assistance in explaining operations of the coating and developing system.

A carrying procedure shown in FIG. 9 is executed to process the wafer W. A query is made in step S1 to see whether or not the exposure system S4 is in the normal state. The carrying procedure goes to step 52 if the exposure system S4 is in the normal state or goes to step S3 if the exposure system S4 is not in the normal state. A carrying operation control procedure to be executed by the COT layer B3 when the exposure system S4 is in the normal state will be described. A query is made in step S3 to see whether or not the S-CPL is vacant. The S-CPL is either of the temperature control modules CPL11 and CPL12 which are used specially for transferring a wafer W to and receiving a wafer W from the shuttle arm E. The modules CPL11 and CPL12 will be referred to inclusively as S-CPL.

If the S-CPL is vacant, the main arm A3 carries out one carrying cycle according to a basic carrying schedule shown in FIG. 11 in step S4. If the S-CPL is not vacant, the buffer module BF31, namely, the last module of the COT layer B3 in the basic carrying module, is changed for another one of the buffer modules BF31 to BF34. The basic carrying schedule for the COT layer B3 is a carrying schedule of carrying a wafer W along a carrying rout passing the CPL3, the COT1, the COT2, the COT3, the LHP3, the WEE and BF31 shown in FIG. 11 in that order. In FIG. 11 showing this carrying schedule, the modules to which a wafer W is to be delivered are arranged on the horizontal axis in carrying order, and carrying cycles are arranged on the vertical axis, namely, a time axis. In FIG. 11, the modules on the left side are upstream modules and those on the right side are downstream modules. In FIG. 11, "CB" denotes the carrier block S1, wafers W01 and W02 are the first and the second wafer, respectively, of a lot.

Figure 10:
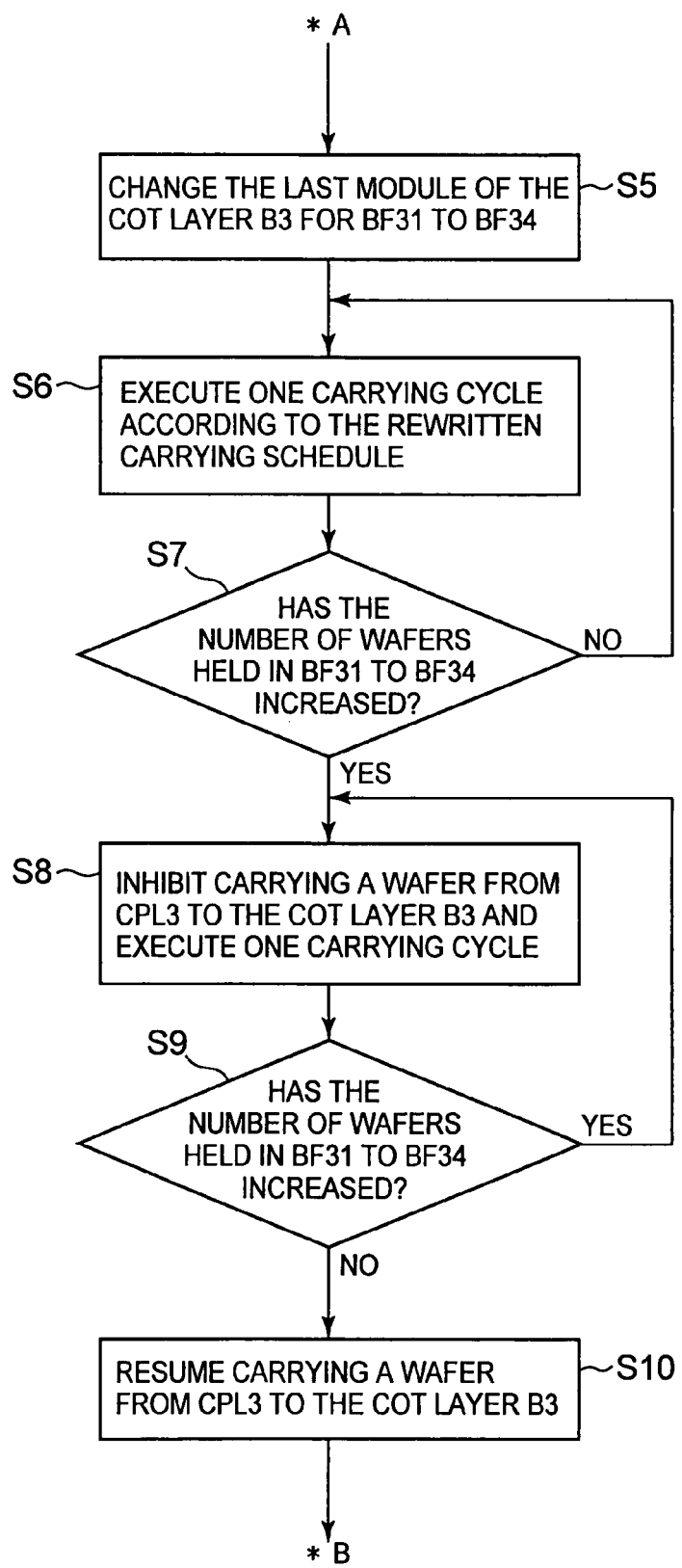
FIG. 10 is a flow chart of assistance in explaining operations of the coating and developing system.

Referring again to the carrying procedure shown in FIG. 10, the main arm A3 completes one carrying cycle according to the rewritten carrying schedule in step S6. In step S7, a query is made to the wafer monitoring unit 74 to see whether or not the number of wafers W held in the buffer modules BF31 to BF34 is increased. The carrying procedure returns to step S6 if the response made in step S7 is negative. A carrying operation of the main arm A3 for carrying a wafer W from the temperature control module CPL3 to the COT layer B3 is inhibited in step S8 and one carrying cycle is executed according to the rewritten carrying schedule if the response to the query made in step S7 is affirmative. A query is made in step S9 to the wafer monitoring unit 74 to see whether or not the number of wafers W held in the buffer modules BF31 to BF34 is increased. The carrying procedure returns to step S8 if the response to the query made in step S9 is affirmative. The carrying operation for carrying a wafer W from the temperature control module CPL3 to the COT layer B3 is resumed in step S10. Thus a resist film is formed on each of the wafers W of the lot by the COT layer B3.

A carrying operation control procedure to be executed by the BCT layer B2 will be described. The carrying operation control procedure, similarly to the carrying operation control procedure to be executed by the COT layer B3, makes a query to the wafer monitoring unit 74 to see whether or not the temperature control module CPL3 is vacant. If the temperature control module CPL3 is vacant, the main arm A2 carries out one carrying cycle according to the basic carrying schedule shown in FIG. 11. If the temperature control module CPL3 is not vacant, the buffer module BF21, namely, the last module of the BCT layer B2, is changed for another one of the buffer modules BF21 to BF24. Then, the main arm A2 carries out one carrying cycle according to a rewritten carrying schedule. The basic carrying schedule for the BCT layer B2 is a carrying schedule of carrying a wafer W along a carrying rout passing the CPL2, the BCT1, the BCT2, the BCT3, the LHP2 and the BF21 shown in FIG. 11 in that order.

A query is made to the wafer monitoring unit 74 to see whether or not the number of wafers W held in the buffer modules BF21 to BF24 is increased. One carrying cycle is accomplished according to the rewritten carrying schedule if the response to the query is negative. A carrying operation for carrying a wafer W from the temperature control module CPL2 to the BCT layer B2 by the main arm A2 is inhibited and one carrying cycle is accomplished according to the rewritten carrying schedule if the response to the query is affirmative. Then, a query is made to the wafer monitoring unit 74 to see whether or not the number of wafers W held in the buffer modules BF21 to BF24 is increased. A carrying operation for carrying a wafer W from the temperature control module CPL2 to the BCT layer B2 is inhibited and one carrying cycle is accomplished according to the rewritten carrying schedule if the response to the query is affirmative. The carrying operation for carrying a wafer W from the temperature control module CPL2 to the BCT layer B2 is resumed if the response to the query is negative. Thus a first antireflection film is formed on each of the wafers W of a lot by the BCT layer B2.

Control of the carrying operation of the transfer arm C will be described. A query is made to the wafer monitoring unit 74 to see whether or not the temperature control module CPL2 is vacant. A carrying operation for carrying a wafer W from the carrier block S1 to the temperature control module CPL2 is started if the temperature control module CPL2 is vacant. A carrying operation for carrying a wafer W from the carrier block S1 to the temperature control module CPL2 is stopped if the temperature control module CPL2 is not vacant.

Figure 12:
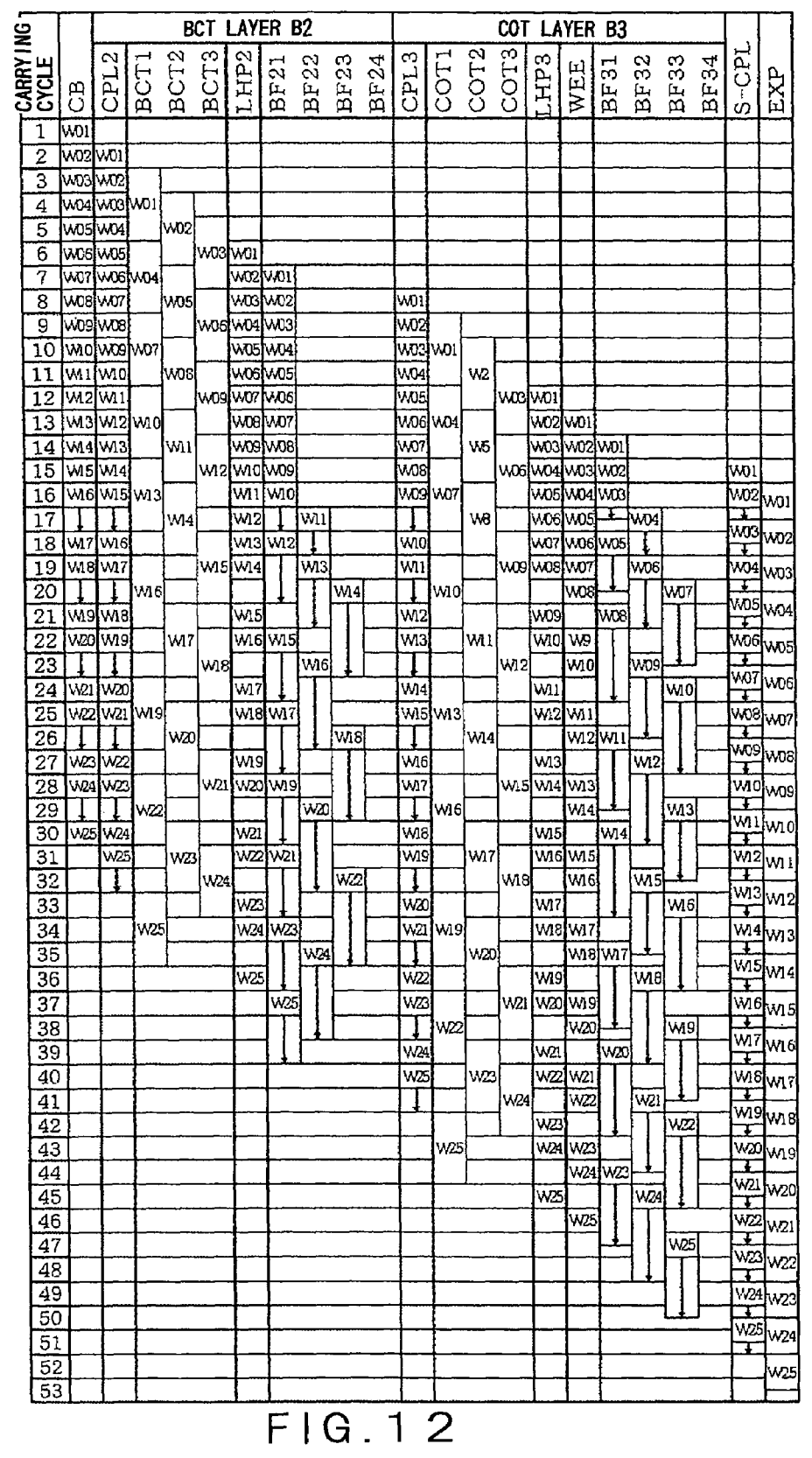

The carrying operation is thus controlled to carry a wafer W, for example, according to a carrying schedule shown in FIG. 12 in the COT layer B3 and the BCT layer B2. This carrying schedule is designed on an assumption that the processing rate of the coating film forming unit blocks, namely, COT layer B3 and the BCT layer B2, is 20 s/wafer, the processing rate of the exposure system S4 is 30 s/wafer; that is, the processing rate of the exposure system S4 is lower than that of the coating film forming unit blocks. The processing rate of the COT layer B3 and the BCT layer B2 corresponds to one carrying cycle specified by the carrying schedule. The processing rate of the exposure system S4 corresponds to 1.5 times one carrying cycle specified by the carrying schedule.

According to the carrying schedule shown in FIG. 12, the first wafer W01 and the second wafer W02 among the wafers W of a lot are carried in step S4 of the carrying procedure shown in FIG. 9 from the carrier block S1 to the S-CPL according to the basic carrying schedule. The processing rate of the exposure system S4 is lower than that of the COT layer B3 and hence the S-CPL is occupied by the second wafer W2 at time when the third wafer W03 is to be carried to the S-CPL. Therefore, the response to the query made in step S2 is negative. In the carrying schedule shown in FIG. 12, the downward arrows indicate the duration of stay in the modules.

In step S5 of the carrying procedure shown in FIG. 10, the last module of the COT layer B3 is changed for one of the buffer modules BF31 to BF34. In step S6, one carrying cycle, namely, a carrying cycle 16, is executed according to a rewritten carrying schedule. Since only the wafer W03 is held in the buffer modules BF31 to BF34 and the response to a query made in step S7 is negative, the next carrying cycle, namely, a carrying cycle 17, is executed in step S6. The carrying cycle 17 carries a wafer W04 to the buffer modules BF31 to BF34. Consequently, the two wafers W are held in the buffer modules BF31 to BF34. Then, a carrying operation for carrying a wafer W from the CPL3 to the COT layer B3 is inhibited in step S8.

Thus a wafer W09 is held in the CPL3, a wafer W10 cannot be carried to the CPL3 in the BCT layer B3 in predetermined timing and the number of wafers W held in the buffer modules BF21 to BF24 increases. Therefore, a carrying operation for carrying a wafer W from the carrier block S1 to the CPL2 by the transfer arm C is inhibited, the main arms A3 and A2 of the COT layer B3 and the BCT layer B2 executes one carrying cycle, namely, a carrying cycle 18, according to the rewritten carrying schedule.

The two wafers W are held in the buffer modules BF31 to BF34 of the COT layer B3 and the number of wafers W held in the buffer modules BF31 to BF34 of the COT layer B3 is not increased. Therefore, in a carrying cycle 18, a carrying operation for sending out a wafer W from the CPL3 is started in step S10. A state where the number of wafers W held in the buffer modules BF31 to BF34 of the COT layer B3 is not increased corresponds to a state where the wafer W03 has been transferred from the buffer module BF31 to the S-CPL and a wafer W05 has been carried to the buffer module BF31. Thus a wafer W is sent out from the CPL3 after a carrying operation for carrying a wafer W from the buffer modules BF31 to BF34 to the module on the downstream side has been started in the carrying cycle 18.

A carrying operation for sending out the wafers W of the lot from the temperature control module CPL3 is inhibited when the number of the wafers W held in the buffer modules BF31 to BF34 of the COT layer B3 is increased. The carrying operation for sending out the wafer W from the temperature control module CPL3 is resumed when a carrying operation for carrying a wafer W from the buffer modules BF31 to BF34 of the COT layer B3 to the downstream module is started. Thus, the COT layer B3 is controlled so that the number of wafers W placed in the modules on the downstream side, namely, the coating modules COT1 to COT3, the heating and cooling module LHP3, the edge exposure module WEE and the buffer modules BF31 to BF34 may not be greater than six.

When the carrying operation for carrying a wafer W from the temperature control module CPL3 is stopped by thus controlling the COT layer B3, in some cases, a wafer W cannot be carried to the temperature control module CPL3 in the BCT layer B2. In such a case, the foregoing control operations for controlling carrying are executed. A carrying operation for sending out a wafer W from the temperature control module CPL2 is inhibited when the number of wafers W held in the buffer modules BF21 to BF24 is increased, the carrying operation for sending out a wafer W from the temperature control module CPL2 is resumed when a carrying operation for carrying a wafer W from the buffer modules BF21 to BF24 of the BCT layer B2 to the downstream module is started. Thus the BCT layer B2 is controlled so that the number of wafers W placed in the modules on the downstream side, namely, the first antireflection film forming modules BCT1 to BCT3, the heating and cooling module LHP2 and the buffer modules BF21 to BF24 may not be greater than five.

The control operation of the COT layer B3 for controlling the carrying operation upon the occurrence of trouble in the exposure system S4 will be described by way of example with reference to FIG. 9. A query is made in step S3 to the wafer monitoring unit 74 to see whether or not the temperature control module S-CPL is vacant. The main arm A3 carries out one carrying cycle according to the basic carrying schedule shown in FIG. 11 if the S-CPL is vacant. An operation for sending out a wafer W from the S-CPL of the COT layer B3 is inhibited in step S1 if the S-CPL is not vacant. Then, in step S12, buffer module BF31, namely, the last module of the COT layer B3, is changed for one of the buffer modules BF31 to BF34. In step S13, the main arm A3 carries out on carrying cycle according to the rewritten carrying schedule.

A query is made to the wafer monitoring unit 74 in step S14 to see whether or not the number of wafers W held in the buffer modules BF31 to BF34 is increased. The carrying procedure returns to step S13 if the response to the query made in step S14 is negative. A carrying operation for carrying a wafer W from the CPL13 to the COT layer B3 is inhibited in step S15 if the response to the query made in step S14 is affirmative. Then, in step S16, a carrying operation is carried out according to the rewritten carrying schedule to place wafers W sequentially in the downstream modules. Thus, four wafers @ are held in the buffer modules BF31 to BF34 of the COT layer B3, and wafers W are placed in the edge exposure module WEE and on the cooling plate 35 of the LHP3.

A control procedure for controlling the carrying operation of the BCT layer B2 will be described. A query is made to see whether or not the temperature control module CPL3 is vacant. The main arm A2 carries out one carrying cycle according to the basic carrying schedule shown in FIG. 10 if the temperature control module CPL3 is vacant. A carrying operation for carrying a wafer W from the BCT layer B3 to the CPL3 is inhibited if the temperature control module CPL3 is not vacant. The buffer module BF21, namely, the last module of the BCT layer B2 is changed for one of the buffer modules BF21 to BF24, and the main arm A2 carries out one carrying cycle according to the rewritten carrying schedule.

A query is made to the wafer monitoring unit 74 to see whether or not the number of wafers W held in the buffer modules BF21 to BF24 is increased. One carrying cycle is accomplished according to the rewritten carrying schedule if the response to the query is negative. A carrying operation for carrying a wafer W from the CPL2 to the BCT layer B2 is inhibited wafers W in the BCT layer B2 are carried according to the rewritten carrying schedule to place wafers W sequentially in the downstream modules if the response to the query is affirmative. Four wafers W are held in the buffer modules BF21 to BF24 of the BCT layer B2 and a wafer W is placed on the cooling plate 35 of the LHP2.

A carrying operation for carrying a wafer W from the temperature control module CPL2 to the BCT layer B2 is inhibited and the response to the response to a query-made to the wafer monitoring unit 74 to see whether or not the temperature control module CPL2 is vacant is negative, and hence a carrying operation for carrying a wafer W from the carrier block S1 to the temperature control module CPL2 is inhibited.

Upon the occurrence of trouble in the exposure system S4, the COT layer B3 stops a carrying operation for carrying wafers W from the buffer modules BF31 to BF34 to the temperature control module S-CPL, and a carrying operation for sending out a wafer W from the temperature control module CPL3 is inhibited when the number of wafers W held in the buffer modules BF31 to BF34 is increased. Thus the COT layer B3 is controlled so that the number of wafers W placed in the modules on the downstream side of the temperature control module CPL3 may not be greater than six. Wafers W are carried sequentially from the downstream buffer modules BF31 to BF34 to the modules after being processed by the predetermined processes in the unit block B3 to place the wafers W sequentially in the modules. The four wafers W among the six wafers W placed in the COT layer B3 are held in the buffer modules BF31 to BF34, and the two wafers W are delivered to the edge exposure module WEE and the heating and cooling module LHP3, respectively.

The BCT layer B2 stops a carrying operation for carrying a wafer W from the buffer modules BF21 to BF24 to the temperature control module CPL3. A carrying operation for sending out a wafer W from the temperature control module CPL2 is inhibited when the number of wafers W held in the buffer modules BF21 to BF24 is increased so that the number of wafers W placed in the modules on the downstream side of the temperature control module CPL2 may not be greater than five. Wafers W processed by predetermined processes in the unit block B2 are delivered to the buffer modules BF21 to BF24 starting from the downstream one of the buffer modules BF21 to BF24. Four wafers W among five wafers W placed in the BCT layer B2 are delivered to the buffer modules BF21 to BF24 and the one wafer W is delivered to the heating and cooling module LHP2.

Figure 13:
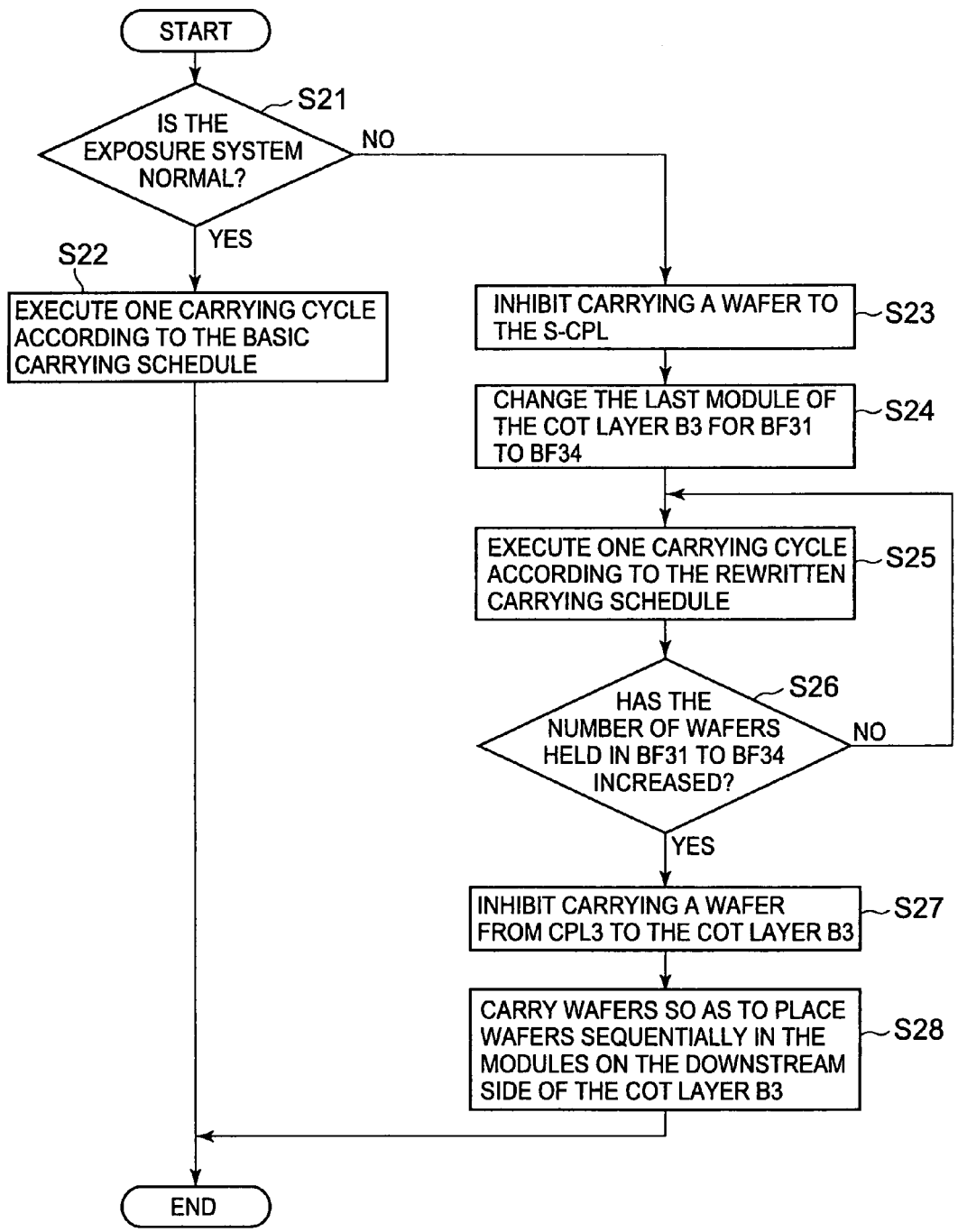
FIG. 13 is a flow chart of assistance in explaining operations of the coating and developing system.

A carrying operation control procedure to be executed by the COT layer B3 will be described by way of example with reference to FIG. 13 on an assumption that the respective processing rates of the COT layer B3, the BCT layer B2 and the exposure system S4 are the same. A query is made in step S21 to see whether or not the exposure system S4 is normal. The main arm A3 carries out one carrying cycle according to the basic carrying schedule shown in FIG. 11 in step S22 if the exposure system S4 is normal. A carrying operation for carrying a wafer W from the COT layer B3 to the S-CPL is inhibited in step S23 if the exposure system S4 is not normal. Then, the last module of the COT layer B3 is changed for one of the buffer modules BF31 to BF34 in step 24, and one carrying cycle is accomplished according to a rewritten carrying schedule in step S25.

In step S26, a query is made to the wafer monitoring unit 74 to see whether or not the number of wafers W held in the buffer modules BF31 to BF34 is increased. The carrying operation control procedure returns to step S25 if the response to the query is negative. A carrying operation for carrying a wafer W from the CPL3 to the COT layer B3 is inhibited in step S27 if the response to the query is negative. Then, in step S28, wafers W in the COT layer B3 are carried according to the rewritten carrying schedule to deliver the wafers W to the modules starting from the downstream module. Thus four wafers W are held in the buffer modules BF31 to BF34, and two wafers W are delivered to the edge exposure module WEE and the cooling plate 35 of the heating and cooling module LHP3.

In the BCT layer B2, a query is made to see whether or not the exposure system S4 is normal. The main arm A2 carries out one carrying cycle according to the basic carrying schedule shown in FIG. 11 if the exposure system S4 is normal. A carrying operation for carrying a wafer W from the BCT layer B2 to the CPL3 is inhibited.

The last module of the BCT layer B2, namely, the buffer module BF21, is changed for one of the buffer modules BF21 to BF24. Then, one carrying cycle is accomplished according to a rewritten carrying schedule. A query is made to the wafer monitoring unit 74 to see whether or not the number of wafers W held in the buffer modules BF21 to BF24 is increased. One carrying cycle is accomplished according to the rewritten carrying schedule if the response to the query is negative. A carrying operation for carrying a wafer W from the CPL2 to the BCT layer B2 is inhibited if the response to the query is affirmative. Then, wafers W in the BCT layer b2 are carried according to the rewritten carrying schedule to deliver the wafers W to the modules starting from the downstream module. Four wafers W are held in the buffer modules BF21 to BF24 in the BCT layer B2, and one wafer W is delivered to the cooling plate 35 of the heating and cooling module LHP2.

Since a carrying operation for carrying a wafer W from the temperature control module CPL2 to the BCT layer B2 is inhibited, the response to a query made to the wafer monitoring unit 74 to see whether or not the temperature control module CPL2 is vacant is negative and hence a carrying operation for carrying a wafer W from the carrier block S1 to the temperature control module CPL3 is inhibited.

If trouble occurs in the exposure system S4 in such a state, the COT layer B3 stops a carrying operation for carrying a wafer W from the buffer modules BF31 to BF34 to the temperature control module S-CPL and inhibits an operation for sending out a wafer W from the temperature control module CPL3 when the number of wafers W held in the buffer modules BF31 to BF34 is increased. The carrying operation is thus controlled so that the number of wafers W placed in the modules on the downstream side of the temperature control module CPL3 may not be greater than six. Wafers W processed by predetermined processes in the unit block B3 W are delivered to the buffer modules BF31 to BF34 starting from the downstream one of the buffer modules BF31 to BF34. Four wafers W among six wafers W placed in the COT layer B3 are delivered to the buffer modules BF31 to BF34 and the two wafers W are delivered to the edge exposure module WEE and the cooling plate 35 of the heating and cooling module LHP3, respectively.

The BCT layer B2 stops a carrying operation for carrying wafers W from the buffer modules BF21 to BF24 to the temperature control module CPL3. A carrying operation for sending out a wafer W from the temperature control module CPL2 is inhibited when the number of wafers W held in the buffer modules BF21 to BF24 is increased so that the number of wafers W placed in the modules on the downstream side of the temperature control module CPL2 may not be greater than five. Wafers W processed by predetermined processes in the unit block B2 are delivered to the buffer modules BF21 to BF24 starting from the downstream one of the buffer modules BF21 to BF24. Four wafers W among the five wafers W placed in the BCT layer B2 are delivered to the buffer modules BF21 to BF24 and one wafer W is delivered to the cooling plate 35 of the heating and cooling module LHP2.

The resist pattern forming system has the coating film forming unit blocks B2 to B4 provided with the buffer modules BF2 to BF4, respectively. Therefore, wafers processed by the coating film forming unit blocks B2 to B4 are held in the buffer modules BF2 to BF4 of the unit blocks B2 to B4 when the processing rate of the exposure system S4 is lower than those of the unit blocks B2 to B4 until the wafer W can be delivered to the exposure system S4. Thus the difference in processing rate between the exposure system S4 and each of the coating film forming unit blocks B2 to B4 can be absorbed.

In the COT layer B3 (the BCT layer B2), the carrying operation of the main arm A3 (A2) for carrying a wafer W@ is controlled such that the number of wafers W placed in the modules on the downstream side of the temperature control module CPL3 (CPL2) is greater by n (one) than the number of modules on a carrying route between the temperature control module CPL3 (CPL2) and the buffer module BF3 (BF2). Therefore, wafers W processed by wet processes by all the wet processing modules COT1 to COT3 (BCT1 to BCT3) can be held in the buffer modules BF31 to BF34 (BF21 to BF24) by inhibiting an operation for sending out a wafer W from the temperature control module CPL3 (CPL2) even if trouble occurs in the exposure system S4 and any wafer W cannot be delivered to the exposure system S4, provided that the buffer module BF3 (BF2) has a capacity to hold a number of wafers W greater by n (one) than the number of the wet processing modules.

Wafers W can be held in the heating and cooling module (LHP3 (LHP2) and the edge exposure module WEE. A wafer W heated by the heating plate 34 of the heating and cooling module LHP3 (LHP2) is transferred to the cooling plate 35 serving also as a carrying arm to transfer the wafer W to the main arm A3 (A2) in predetermined timing. Since the wafer W is held on the cooling plate 35, the wafer W will not be excessively processed by the heating process and hence changes in quality of the coating films formed on the wafer W is suppressed. Since holding a wafer W in the edge exposure module WEE does not have any adverse effect on the coating films, there is no possibility that the quality of the coating films formed on the wafer W changes even if the wafer W is held in the edge exposure module WEE. Since the COT layer B3 and the BCT layer B2 are provided with the buffer modules BF3 and BF2, respectively, all the wafers W processed by the predetermined processes in the COT layer B3 and the BCT layer B2 can be held until the wafers W can be delivered to the exposure system S4 without changing the quality of the coating films formed on the wafers W. Those wafers W can be processed by the exposure process by the exposure system S4 after the exposure system S4 has resumed its operation. Thus the coating film forming processes can be continuously carried out and hence the reduction of yield can be suppressed.

In this example, n=1. Therefore, wafers W processed by predetermined processes in the COT layer B3 (BCT layer B2) can be held in the buffer module BF3 (BF2) so that changes in quality of the coating films formed on the wafers W may be suppressed, provided that the number of wafers W that can be held in the buffer module BF3 (BF2) is greater by one than the number of the modules of the COT layer B3 (BCT layer B2). Therefore, increase in size of the buffer module BF3 (BF2) is suppressed and the buffer module BF3 (BF2) can be installed in the coating film forming unit block.

The main arms A2 to A4 access the buffer modules BF2 to BF4 installed in the coating film forming unit blocks B2 to B4, respectively. Therefore, load on the interface arm is lighter than that will be loaded on the interface arm when the buffer module is installed in the interface block S3. Thus, a desired throughput can be achieved even if the interface block S3 is provided with the single interface arm F. Since the interface block S3 needs the single interface arm F instead of two interface arms, the manufacturing cost can be reduced. Since only the single interface arm F is installed in the interface block S3, the foot print of the resist film forming system is small.

Figure 14:
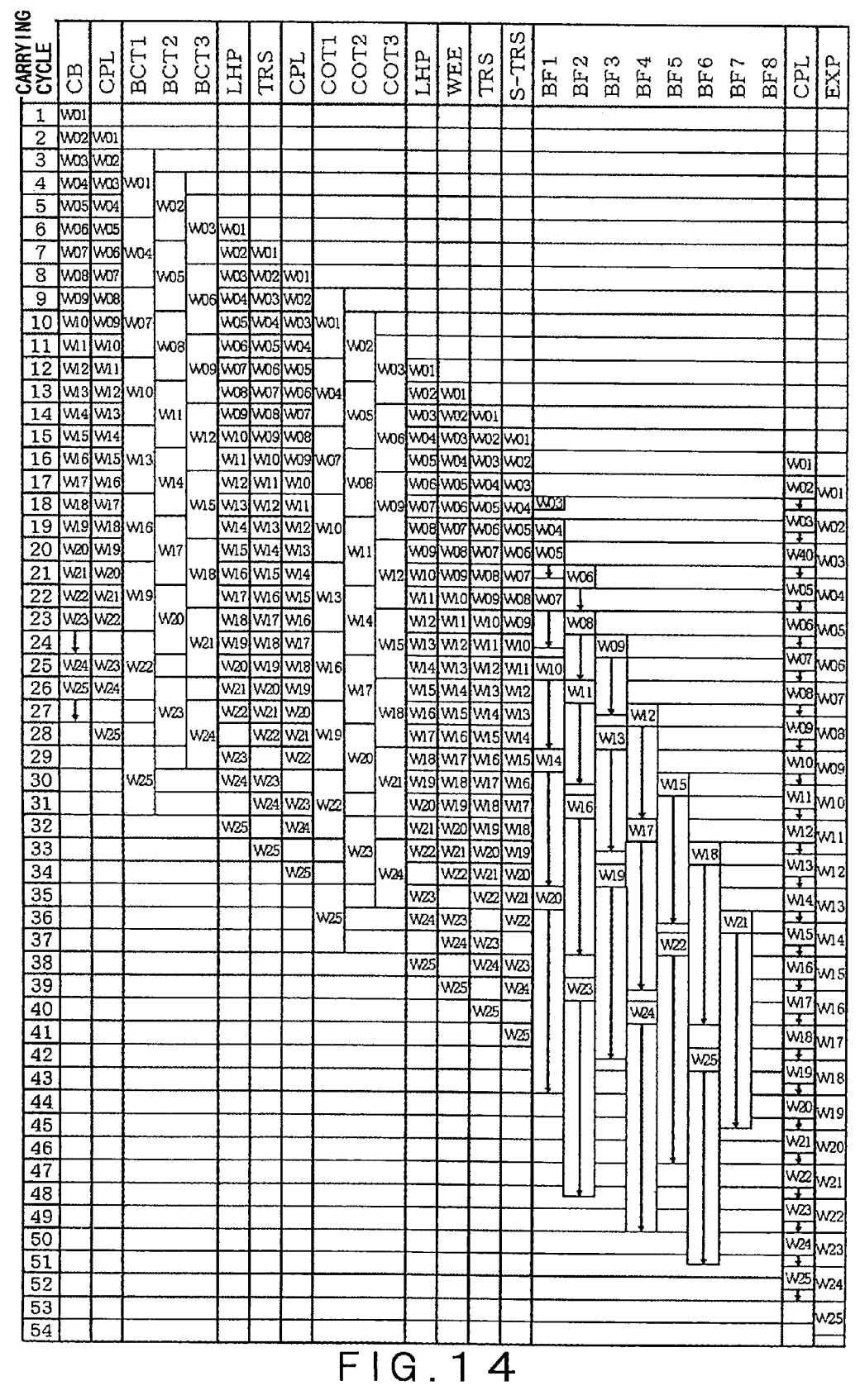
Figure 15:
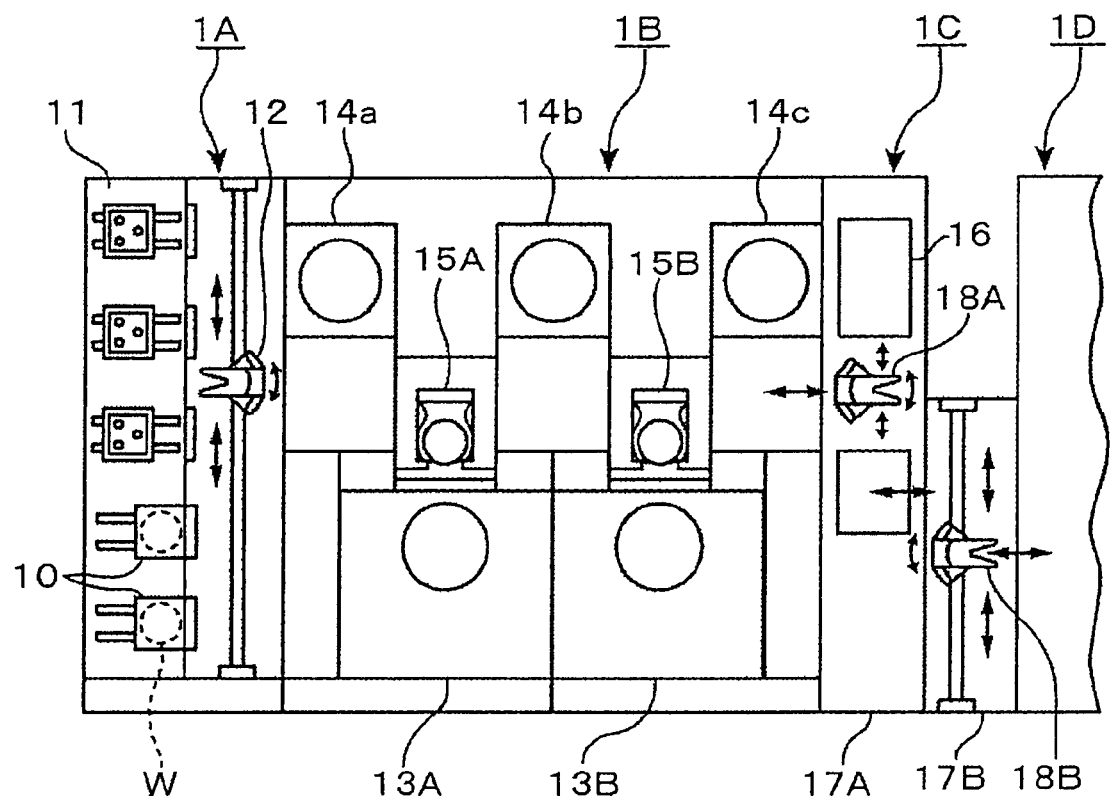
FIG. 15 is a plan view of a conventional coating and developing system.

FIG. 14 shows a carrying schedule to be carried out by the conventional resist pattern forming system shown in FIG. 15. The buffer module of the resist pattern forming system has a capacity to hold all the wafers W in the processing blocks. The buffer module is designed to hold sixteen wafers W when the number of all the modules of the processing blocks is fourteen. In the carrying schedule shown in FIG. 14, it is assumed that the buffer module BF can hold eight wafers W for convenience. According to this carrying schedule, carrying operations are controlled so that sixteen wafers W can be held in modules from the temperature control module CPL to the buffer module BF. If the number of the wafers W exceeds sixteen, the resist pattern forming system is controlled so as to stop sending out wafers W from the carrier block CB.

The conventional resist pattern forming system carries out a first antireflection film forming process, a resist solution application process and a developing process in the single processing block. Therefore, many modules are installed in the processing block. If the buffer module is designed in a capacity to hold a number of wafers W greater than the number of those modules, the buffer module is inevitably large. It is known from this carrying schedule that the load on the interface arm is high because the buffer module is installed in the interface block.

Recently it is desired to keep a wafer W at a fixed temperature while the wafer W is being carried to the exposure system to enhance the accuracy of exposure. Therefore, the temperature of the wafer W needs to be adjusted by the temperature control module CPL before transferring the wafer W to the exposure system. If the buffer module is installed in the interface block, the wafer W needs to be carried to the temperature control module CPL before being transferred to the exposure system. Consequently, carrying processes increases, a temperature control module CPL needs to be installed in the interface block, and hence the interface block becomes large. According to the carrying schedule shown in FIG. 14, time for which the wafer W is held in the buffer module is longer than that for which the wafer W is held in the buffer module when wafers W are carried according to the carrying schedule of the present invention shown in FIG. 11.

Therefore, it is possible that the temperature controlling time needed by the temperature control module CPL becomes longer.

In the resist pattern forming system according to the present invention, the buffer modules BF2 to BF4 are the last modules on the carrying routes in the coating film forming unit blocks, respectively. Therefore, the transfer arm D, as well as the main arms of the unit blocks in which the buffer modules are installed, can access the buffer modules BF2 to BF4 when the buffer modules BF2 to BF4 are installed in the shelf module U2, which facilitates carrying a wafer W to the unit block which carries out the nest process. The shuttle arm carries a wafer from the temperature control module CPL11 to the temperature control module CPL12 to deliver the wafer W to the exposure system. Since the temperature control modules CPL11 and CPL12 (S-CPL) has a temperature control function, the temperature of a wafer W can be controlled while the wafer W is being carried. Therefore, a wafer W does not need to be carried to another temperature control module CPL before being delivered to the exposure system S4, which reduces carrying steps. Since the interface unit S3 does not need to be provided with any temperature control module CPL, increase in the footprint of the resist pattern forming system can be suppressed.

The present invention is applicable to forming only a resist film as a coating film, forming a second antireflection film on a resist film, and forming a first antireflection film, a resist film and a second antireflection film. A wafer W is carried along a carrying route passing the carrier block S1, CPL2, CPL3, COT, LHP3, WEE, the buffer module BF3, CPL11, CPL12 and the exposure system S4 in that order. When n=1, an operation for sending out a wafer W from the temperature control module CPL3 is inhibited if the number of wafers W to be carried to the buffer modules BF31 to BF34 increases to limit the number of wafers W placed in the modules on the downstream side of the temperature control module CPL3 to six. When trouble occurs in the exposure system 54, an operation for carrying a wafer W from the buffer modules BF31 to BF34 to the temperature control module S-CPL is stopped and an operation for transferring a wafer W from the carrier block S1 to the temperature control module CPL2 is stopped.

To form a second antireflection film on a resist film, a wafer W is carried along a carrying route passing the carrier block S1, CPL2, CPL3, COT, LHP3, the buffer module B3, CPL4, TCT, LHP4, WEE, the buffer module BF4, CPL11, CPL12 and the exposure system S4 in that order. When n=1, an operation for sending out a wafer W from the temperature control module CPL4 is inhibited if the number of wafers W to be carried to the buffer modules BF41 to BF44 increases to limit the number of wafers W placed in the modules on the downstream side of the temperature control module CPL4 to six, which is greater by one than the number of modules from the module on the downstream side of the temperature control module CPL4 to the buffer module B4. When trouble occurs in the exposure system S4, an operation for carrying a wafer W from the buffer modules BF41 to BF44 to the temperature control module S-CPL is stopped. When n=1, an operation for sending out a wafer W from the temperature control module CPL3 of the COT layer 3 is inhibited when the number of wafers W held in the buffer modules BF31 to BF34 increases to limit the number of wafers W placed in the modules on the downstream side of the temperature control module CPL3 to five, which is greater by one than the number of modules from the module on the downstream side of the temperature control module CPL3 to the buffer module B3. When trouble occurs in the exposure system S4, an operation for carrying a wafer W from the buffer modules BF31 to BF34 to the temperature control module CPL4 is stopped and transfer of a wafer W from the carrier block S1 to the temperature control module CPL2 is stopped.

When a first antireflection film, a resist film and a second antireflection film are to be formed, a wafer W is carried along a carrying route passing the carrier block S1, CPL2, BCT, LHP2, buffer module BF2, CPL3, COT, LHP3, the buffer module BF3, CPL4, TCT, LHP4, WEE, the buffer module BF4, CPL11, CPL12 and the exposure system S4 in that order. In the TCT layer B4, when n=1, an operation for sending out a wafer W from the temperature control module CPL4 is inhibited when the number of wafers W held in the buffer modules BF41 to BF44 increases to limit the number of wafers W placed in the modules on the downstream side of the temperature control module CPL4 to six, which is greater by one than the number of modules from the module on the downstream side of the temperature control module CPL4 to the buffer module BF4. When trouble occurs in the exposure system S4, an operation for carrying a wafer W from the buffer modules BF41 to BF44 to the temperature control module S-CPL is stopped.

In the COT layer B3, when n=1, an operation for sending out a wafer W from the temperature control module CPL3 is inhibited when the number of wafers W held in the buffer modules BF31 to BF34 increases to limit the number of wafers W placed in the modules on the downstream side of the temperature control module CPL3 to five, which is greater by one than the number of all the modules from the module on the downstream side of the temperature control module CPL3 to the buffer module BF3. When trouble occurs in the exposure system S4, an operation for carrying a wafer W from the buffer modules BF31 to BF34 to the temperature control module CPL4 is stopped. In the BCT layer B2, when n=1, an operation for sending out a wafer W from the temperature control module CPL2 is inhibited when the number of wafers W held in the buffer modules BF21 to BF24 increases to limit the number of wafers W placed in the modules on the downstream side of the temperature control module CPL3 to five, which is greater by one than the number of all the modules from the module on the downstream side of the temperature control module CPL2 to the buffer module BF3. When trouble occurs in the exposure system S4, an operation for carrying a wafer W from the buffer modules BF21 to BF24 to the temperature control module CPL2 is stopped.

In the foregoing embodiment, a carrying schedule for the COT layer B3 is changed when a wafer W cannot be carried to the temperature control module S-CPL of the COT layer B3, a carrying schedule for the BCT layer B2 is changed when a wafer W cannot be carried to the temperature control module CPL3 of the BCT layer B2, and an operation for sending out a wafer W from the carrier block S1 by the transfer arm C is stopped when a wafer W cannot be carried to the temperature control module CPL2. The COT layer B3, the BCT layer B2 and the transfer arm C are thus controlled individually. A wafer W cannot be carried to the temperature control module CPL3 in the BCT layer B2 and a wafer W cannot be transferred from the carrier block S1 to the temperature control module CPL2 when a wafer W cannot be carried to the temperature control module S-CPL of the COT layer B3. Therefore, when a wafer W cannot be carried to the temperature control module S-CPL in the COT layer B3, the carrying schedules for the COT layer B3 and the BCT layer B2 may be rewritten, and an operation for sending out a wafer W from the carrier block S1 by the transfer arm C may be stopped.

The buffer module of the present invention may be such a buffer module capable of holding a number of substrates greater by n+1 than the number of the wet processing modules, provided that the buffer module is used in carrying wafers by the main arm in the unit block such that the number of wafers place in the modules on the downstream side of the temperature control module is greater by n than the number of the wet processing modules arranged between the temperature control module and the buffer module.

According to the present invention, the number, the type and the layout of the modules are not limited to those of the foregoing embodiment, provided that a buffer module capable of holding a number of wafers greater by n than the number of wet processing modules for applying coating solutions to a wafer is installed in the coating film forming unit block, a wafer is carried along a carrying route passing a temperature control module for adjusting the temperature of a wafer, a wet processing module for applying a coating solution to a wafer, a heating and cooling module for heating a wafer and cooling the heated wafer, and a buffer module, and a main arm can carry wafers in the unit block such that the number of wafers placed in modules on the downstream side of the temperature control module is greater by n than the number all the modules between the-temperature control module and the buffer module on the carrying route.

In the foregoing embodiment, the heating and cooling module heats a wafer W and cools the heated wafer W. The heating and cooling module may be replaced with a heating module for heating a wafer W and a cooling module for cooling a wafer W, and a wafer W heated by the heating module may be transferred to the cooling module. In such a case, when n=1, wafers W are carried by the main arm A3 (A2, A4) such that the number of all the wafers W placed in the modules on the downstream side of the temperature control module CPL3 (CPL2, CPL4) in the coating film forming unit block B3 (B2, B4) is greater by n−1 than the number of modules between the temperature control module CPL3 (CPL2, CPL4) and the buffer modules BF31 to BF34 (BF21 to BF24, BF41 to BF44) on the carrying route; that is, the number of all the wafers W is equal to that of the modules.

For example, in the COT layer B3, when n=1, COT1, COT2, COT3, the heating module, the cooling module and the edge exposure module WEE are arranged between the temperature control module CPL3 and the buffer modules BF31 to BF34 on the carrying route; that is, the number of the modules between the temperature control module CPL3 and the buffer modules BF31 to BF34 on the carrying route is six. The main arm A3 carries wafers W in the COT layer B3 so that the number of all the wafers W placed in the modules on the downstream side is six. When trouble occurs in the exposure system S4, for example, four wafers W, one wafer W and one wafer W among six wafers W processed by predetermined processes in the COT layer B3 are held in the buffer modules BF31 to BF34, the edge exposure module WEE and the cooling module, respectively. In the foregoing embodiment, the wafer W is transferred between the BCT layer B2 and the COT layer B3 or between the COT layer B3 and the TCT layer B4 through one of the stages-of each of the buffer module BF2 and BF3. The resist film forming system may be provided with transfer stages through which a wafer W is transferred between the BCT layer B2 and the COT layer B3 or between the COT layer B3 and the TCT layer B4, in addition to the buffer modules BF2 and BF3.

The number of the unit blocks and stacking order of the unit blocks may be different from those described above. Developing unit blocks may be stacked in two layers, the TCT layer, the COT layer, and the BCT layer may be stacked upward in that order. The coating film forming unit blocks may be arranged in lower layers and the developing unit block may be disposed on top of the stacked coating film forming unit blocks. The present invention applicable not only to coating and developing systems for processing semiconductor wafers, but also to coating and developing systems for processing substrates other than semiconductor wafers, such as glass substrates for liquid crystal displays (LCD substrates).

What is claimed is:

1. A coating and developing system for forming coating films including a resist film on a substrate carried to a carrier block by a carrier by one or a plurality of coating film forming unit blocks stacked one on top of another, carrying the substrate through an interface block to an exposure system after the coating films including the resist film have been formed on the substrate, processing the substrate returned through the interface block from the exposure system by a developing process by a developing unit block put on top of the stacked coating film forming unit blocks, and transferring the substrate processed in the developing unit block to the carrier block, each of the unit blocks comprising a plurality of modules in which the substrate is placed, and a substrate carrying means for carrying the substrate among the modules, the substrate carrying means repeating a carrying cycle in which substrates are carried according to a predetermined carrying schedule to transfer the substrates in due order from the upstream modules to the downstream modules such that the substrates of lower numbers are in the modules of higher ordinal numbers than the substrates of higher numbers, said coating and developing system comprising:

temperature control modules for controlling the temperature of the substrate, wet processing modules for coating the substrate with a coating solution, and heating and cooling modules for heating the substrate and cooling the heated substrate installed in the coating film forming unit blocks;

buffer modules each capable of holding a number of substrates greater by n than the number of the wet processing modules; and a controller for controlling the substrate carrying means of each of the unit blocks to carry the substrate in the coating film forming unit block along a carrying route passing the temperature control module, the wet processing module, the heating and cooling module and the buffer module in that order such that the number of substrates placed in the modules on the downstream side of the temperature control module is greater by n than the number of the modules between the temperature control module and the buffer module on the carrying route when a processing rate at which the exposure system processes substrates is lower than that at which the unit block processes substrates.

2. The coating and developing system according to claim 1, wherein the heating and cooling module includes a heating module for heating a substrate, and a cooling module for cooling a substrate, and the controller controls the substrate carrying means of each of the unit blocks such that the number of substrates placed in the modules on the downstream side of the temperature control module is greater by n−1 than the number of modules between the temperature control module and the buffer module.

3. The coating and developing system according to claim 2 further comprising:

transfer modules, included in the one coating film forming unit block or each of the plurality of coating film forming unit blocks and in the developing unit block, for transferring a substrate from one to another of the unit blocks; and transfer means for transferring a wafer between the transfer modules of each of the unit blocks;

wherein substrates are transferred between the buffer module and the substrate carrying means of each coating film forming unit block and between the buffer module and the transfer means.

4. The coating and developing system according to claim 1, wherein the controller includes a substrate carrying means control means for controlling the substrate carrying means so as to stop an operation of the substrate carrying means for sending out a substrate from the temperature control means when the number of substrates held in the buffer module is increased by one.

5. The coating and developing system according to claim 4, wherein the controller includes a substrate carrying means control means for controlling the substrate carrying means so as to resume the operation of the substrate carrying means for sending out a substrate from the temperature control module when a carrying operation for carrying a substrate from the buffer module to the module on the downstream side of the buffer module is started.

6. The coating and developing system according to claim 5 further comprising:

transfer modules, included in the one coating film forming unit block or each of the plurality of coating film forming unit blocks and in the developing unit block, for transferring a substrate from one to another of the unit blocks; and transfer means for transferring a wafer between the transfer modules of each of the unit blocks;

wherein substrates are transferred between the buffer module and the substrate carrying means of each coating film forming unit block and between the buffer module and the transfer means.

7. The coating and developing system according to claim 4 further comprising:

transfer modules, included in the one coating film forming unit block or each of the plurality of coating film forming unit blocks and in the developing unit block, for transferring a substrate from one to another of the unit blocks; and transfer means for transferring a wafer between the transfer modules of each of the unit blocks;

wherein substrates are transferred between the buffer module and the substrate carrying means of each coating film forming unit block and between the buffer module and the transfer means.

8. The coating and developing system according to claim 1 further comprising:

transfer modules, included in the one coating film forming unit block or each of the plurality of coating film forming unit blocks and in the developing unit block, for transferring a substrate from one to another of the unit blocks; and transfer means for transferring a wafer between the transfer modules of each of the unit blocks;

wherein substrates are transferred between the buffer module and the substrate carrying means of each coating film forming unit block and between the buffer module and the transfer means.

9. A coating and developing system for forming coating films including a resist film on a substrate carried to a carrier block by a carrier by one or a plurality of coating film forming unit blocks stacked one on top of another, carrying the substrate through an interface block to an exposure system after the coating films including the resist film have been formed on the substrate, processing the substrate returned through the interface block from the exposure system by a developing process by a developing unit block put on top of the stacked coating film forming unit blocks, and transferring the substrate processed in the developing unit block to the carrier block, each of the unit blocks comprising a plurality of modules in which the substrate is placed, and a substrate carrying means for carrying the substrate among the modules, the substrate carrying means repeating a carrying cycle in which substrates are carried according to a predetermined carrying schedule to transfer the substrates in due order from the upstream modules to the downstream modules such that the substrates of lower numbers are in the modules of higher ordinal numbers than the substrates of higher numbers, said coating and developing system comprising:

temperature control modules for controlling the temperature of the substrate, wet processing modules for coating the substrate with a coating solution, and heating and cooling modules for heating the substrate and cooling the heated substrate installed in the coating film forming unit blocks;

buffer modules each capable of holding a number of substrates greater by n than the number of the wet processing modules; and a controller capable of controlling the substrate carrying means of each of the unit blocks, upon the occurrence of trouble in the exposure system, to carry a substrate in the coating film forming unit block along a carrying route passing the temperature control module, the wet processing module, the heating and cooling module and the buffer module in that order such that the number of substrates placed in the modules on the downstream side of the temperature control module is greater by n than the number of the modules between the temperature control module and the buffer module on the carrying route and the carrying means of each of the unit blocks carries substrates processed normally by the coating film forming unit block to the buffer module, and of providing a control command inhibiting sending out a substrate from and carrying a substrate into the unit block.

10. The coating and developing system according to claim 9, wherein the heating and cooling module includes a heating module for heating a substrate, and a cooling module for cooling a substrate, and the controller controls the substrate carrying means of each of the unit blocks such that the number of substrates placed in the modules on the downstream side of the temperature control module is greater by n−1 than the number of modules between the temperature control module and the buffer module.

11. The coating and developing system according to claim 10 further comprising:
transfer modules, included in the one or each of the plurality of coating film forming unit blocks and in the developing unit block, for transferring a substrate from one to another of the unit blocks; and
transfer means for transferring a wafer between the transfer modules of each of the unit blocks;
wherein substrates are transferred between the buffer module and the substrate carrying means of each coating film forming unit block and between the buffer module and the transfer means.

12. The coating and developing system according to claim 9, wherein the controller includes a substrate carrying means control means for controlling the substrate carrying means so as to stop an operation of the substrate carrying means for sending out a substrate from the temperature control means when the number of substrates held in the buffer module is increased by one.

13. The coating and developing system according to claim 12, wherein the controller includes a substrate carrying means control means for controlling the substrate carrying means so as to resume the operation of the substrate carrying means for sending out a substrate from the temperature control module when a carrying operation for carrying a substrate from the buffer module to the module on the downstream side of the buffer module is started.

14. The coating and developing system according to claim 13 further comprising:
transfer modules, included in the one coating film forming unit block or each of the plurality of coating film forming unit blocks and in the developing unit block, for transferring a substrate from one to another of the unit blocks; and
transfer means for transferring a wafer between the transfer modules of each of the unit blocks;
wherein substrates are transferred between the buffer module and the substrate carrying means of each coating film forming unit block and between the buffer module and the transfer means.

15. The coating and developing system according to claim 12 further comprising:
transfer modules, included in the one coating film forming unit block or each of the plurality of coating film forming unit blocks and in the developing unit block, for transferring a substrate from one to another of the unit blocks; and
transfer means for transferring a wafer between the transfer modules of each of the unit blocks;
wherein substrates are transferred between the buffer module and the substrate carrying means of each coating film forming unit block and between the buffer module and the transfer means.

16. The coating and developing system according to claim 9 further comprising:
transfer modules, included in the one coating film forming unit block or each of the plurality of coating film forming unit blocks and in the developing unit block, for transferring a substrate from one to another of the unit blocks; and
transfer means for transferring a wafer between the transfer modules of each of the unit blocks;
wherein substrates are transferred between the buffer module and the substrate carrying means of each coating film forming unit block and between the buffer module and the transfer means.

17. A coating and developing method comprising the steps of:
forming coating films including a resist film on a substrate carried to a carrier block by a carrier by one coating film forming unit block or by a plurality of coating film forming unit blocks stacked one on top of another;
carrying the substrate through an interface block to an exposure system after the coating films including the resist film have been formed on the substrate; and
processing the substrate returned through the interface block from the exposure system by a developing process by a developing unit block put on top of the coating film forming unit block and transferring the substrate to the carrier block;
the unit block including a plurality of modules in which the substrate is placed, and a substrate carrying means for carrying the substrate among the modules, the substrate carrying means repeating a carrying cycle in which substrates are carried according to a predetermined carrying schedule to transfer the substrates in due order from the upstream modules to the downstream modules such that the substrates of lower ordinal numbers are in the modules of higher ordinal numbers than the substrates of higher ordinal numbers;

wherein the coating film forming unit block includes temperature control modules for controlling the temperature of the substrate, wet processing modules for applying a coating solution to the substrate, heating and cooling modules for heating the substrate and cooling the heated substrate, and a buffer module capable of holding a number of substrates greater than by n than the number of the wet processing modules, the substrate is carried in the coating film forming unit block along a carrying route extending between the temperature control module to the buffer module and passing the temperature control module, the wet processing module, the heating and cooling module and the buffer module in that order, and the substrate carrying means carries substrates such that the number of substrates placed in the modules on the downstream side of the temperature control module is greater by n than the number of the modules between the temperature control module and the buffer module on the carrying route when a processing rate at which the exposure system processes substrates is lower than that at which the coating film forming unit block processes substrates.

18. The coating and developing method according to claim 17, wherein the heating and cooling module includes a heating module for heating a substrate, and a cooling module for cooling a substrate, and the substrate carrying means of each of the unit blocks carries substrates such that the number of substrates placed in the modules on the downstream side of the temperature control module is greater by n−1 than the number of modules between the temperature control module and the buffer module.

19. A storage medium storing a computer program to be executed by a coating and developing system, which forms coating films including a resist film on a substrate received from a carrier block in which a carrier containing a plurality of substrates is placed by one coating film forming unit block or by a plurality of coating film forming unit blocks stacked one on top of another, and processes the substrate processed by an exposure process by a developing process by a developing unit block put on top of the coating film forming unit block, wherein the computer program includes instructions for carrying out the steps of the coating and developing method according to claim 18.

20. A storage medium storing a computer program to be executed by a coating and developing system, which forms coating films including a resist film on a substrate received from a carrier block in which a carrier containing a plurality of substrates is placed by one coating film forming unit block or by a plurality of coating film forming unit blocks stacked one on top of another, and processes the substrate processed by an exposure process by a developing process by a developing unit block put on top of the coating film forming unit block, wherein the computer program includes instructions for carrying out the steps of the coating and developing method according to claim 17.

21. A coating and developing method of forming coating films including a resist film on a substrate carried to a carrier block by a carrier by one coating film forming unit block or by a plurality of coating film forming unit blocks stacked one on top of another, carrying the substrate through an interface block to an exposure system after the coating films including the resist film have been formed on the substrate, and processing the substrate returned through the interface block from the exposure system by a developing process by a developing unit block put on top of the coating film forming unit block and transferring the substrate to the carrier block;

the unit block including a plurality of modules in which the substrate is placed, and a substrate carrying means for carrying the substrate among the modules, the substrate carrying means repeating a carrying cycle in which substrates are carried according to a predetermined carrying schedule to transfer the substrates in due order from the upstream modules to the downstream modules such that the substrates of lower ordinal numbers are in the modules of higher ordinal numbers than the substrates of higher ordinal numbers, the coating film forming unit block including temperature control modules for controlling the temperature of the substrate, wet processing modules for applying a coating solution to the substrate, heating and cooling modules for heating the substrate and cooling the heated substrate, and a buffer module capable of holding a number of substrates greater by n than the number of the wet processing modules;

said coating and developing method comprising the steps of:

carrying the substrate in the coating film forming unit block along a carrying route extending from the temperature control module to the buffer module and passing the temperature control module, the wet processing module, the heating and cooling module and the buffer module in that order, and carrying substrates by the substrate carrying means along the carrying route in order of the temperature control module, the wet processing module, the heating and cooling module and the buffer module such that the number of substrates placed in the modules on the downstream side of the temperature control module is greater by n than the number of the modules between the temperature control module and the buffer module on the carrying route, and the substrate carrying means carries substrates in the unit block to the buffer module after the substrates have been processed in the unit block;

inhibiting sending out a substrate from the coating film forming unit block; and inhibiting carrying a substrate into the coating film forming unit block to be executed.

22. The coating and developing method according to claim 21, wherein the heating and cooling module includes a heating module for heating a substrate, and a cooling module for cooling a substrate; and the substrate carrying means carries substrates such that the number of substrates placed in the modules on the downstream side of the temperature control module is greater by n−1 than the number of modules between the temperature control module and the buffer module.

23. A storage medium storing a computer program to be executed by a coating and developing system, which forms coating films including a resist film on a substrate received from a carrier block in which a carrier containing a plurality of substrates is placed by one coating film forming unit block or by a plurality of coating film forming unit blocks stacked one on top of another, and processes the substrate processed by an exposure process by a developing process by a developing unit block put on top of the coating film forming unit block, wherein the computer program includes instructions for carrying out the steps of the coating and developing method according to claim 22.

24. A storage medium storing a computer program to be executed by a coating and developing system, which forms coating films including a resist film on a substrate received from a carrier block in which a carrier containing a plurality of substrates is placed by one coating film forming unit block or by a plurality of coating film forming unit blocks stacked one on top of another, and processes the substrate processed by an exposure process by a developing process by a developing unit block put on top of the coating film forming unit block, wherein the computer program includes instructions for carrying out the steps of the coating and developing method according to claim 21.

* * * * *